United States Patent
Fujii et al.

(10) Patent No.: US 9,293,637 B2
(45) Date of Patent: Mar. 22, 2016

(54) LIGHT EMITTING ELEMENT AND DISPLAY DEVICE INCLUDING A LIGHT-EMITTING REGION HAVING RIDGE STRIPE STRUCTURES

(71) Applicant: Sony Corporation, Tokyo (JP)

(72) Inventors: Kentaro Fujii, Kanagawa (JP); Tomoki Ono, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/449,785

(22) Filed: Aug. 1, 2014

(65) Prior Publication Data

US 2015/0041757 A1 Feb. 12, 2015

(30) Foreign Application Priority Data

Aug. 8, 2013 (JP) ................................. 2013-164884

(51) Int. Cl.
  *H01L 29/06* (2006.01)
  *H01L 33/00* (2010.01)
(52) U.S. Cl.
  CPC ........ *H01L 33/0045* (2013.01); *H01L 33/0095* (2013.01)
(58) Field of Classification Search
  CPC ...... H01L 33/22; H01L 33/06; H01L 33/0045
  See application file for complete search history.

(56) References Cited

U.S. PATENT DOCUMENTS

| 6,167,074 A * | 12/2000 | Sun ....................... H01S 5/4031 372/23 |
| 6,426,967 B1 * | 7/2002 | Tanabe .................. H01S 5/2231 372/46.01 |
| 2006/0094141 A1 * | 5/2006 | Tsunoda ................ B82Y 20/00 438/22 |
| 2009/0092163 A1 * | 4/2009 | Hirata et al. ............... 372/45.01 |
| 2010/0025712 A1 * | 2/2010 | Weyers .................... H01L 33/08 257/98 |
| 2010/0027573 A1 * | 2/2010 | Yokoyama et al. ........ 372/38.02 |

FOREIGN PATENT DOCUMENTS

| JP | 02-310975 A | 12/1990 |
| JP | 2009-25462 A | 2/2009 |

* cited by examiner

*Primary Examiner* — Bilkis Jahan
(74) *Attorney, Agent, or Firm* — Sheridan Ross P.C.

(57) ABSTRACT

A light-emitting element includes a light-emitting region which is made from a stacked structure configured from a first compound semiconductor layer, an active layer, and a second compound semiconductor layer, and a light propagation region which is made from the stacked structure, extends from the light-emitting region, and has a light-emitting end surface. The light-emitting region is configured from a ridge stripe structure and ridge stripe adjacent portions positioned at both sides of the ridge stripe structure, and when a thickness of the second compound semiconductor layer in the ridge stripe adjacent portions is set to $d_1$, a thickness of the second compound semiconductor layer in the light propagation region is set to $d_2$, and a thickness of the second compound semiconductor layer in the ridge stripe structure is set to $d_3$, $d_3 > d_2 > d_1$ is satisfied.

20 Claims, 20 Drawing Sheets

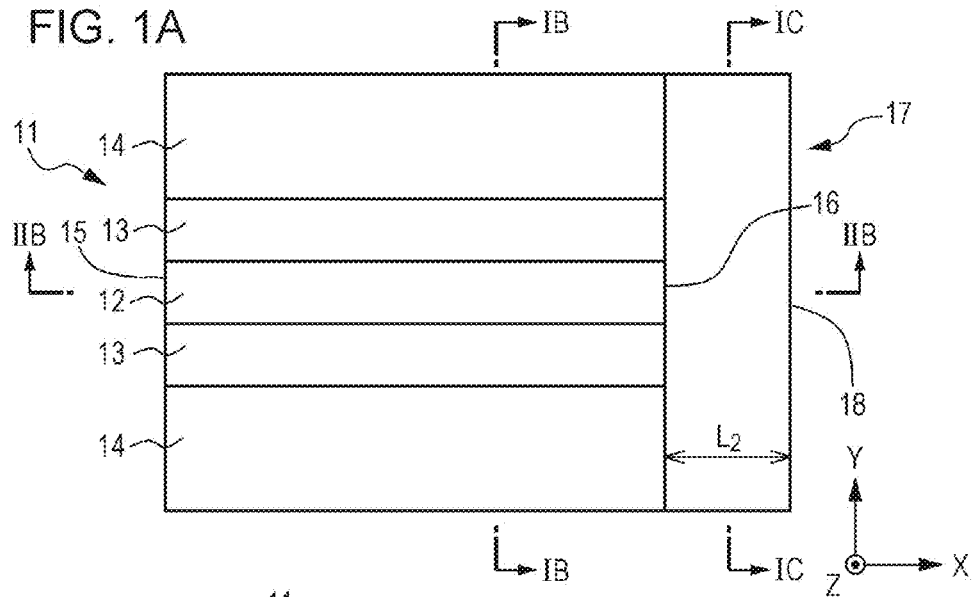
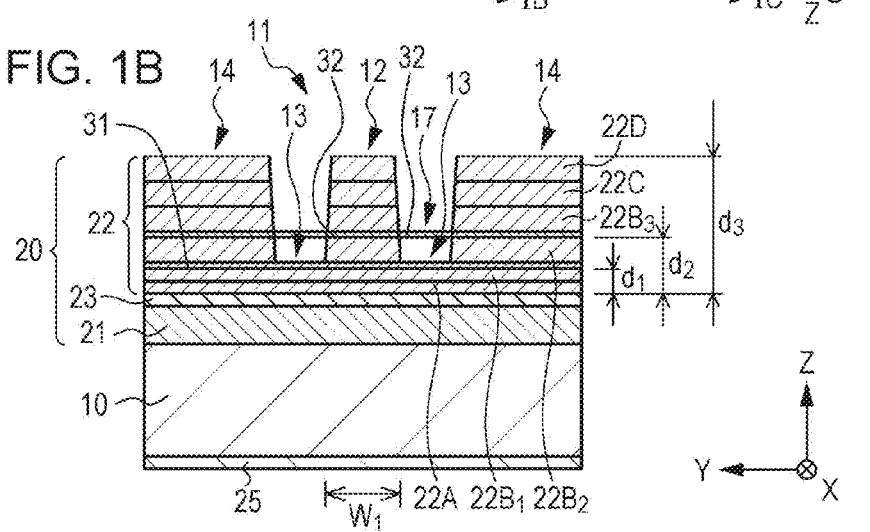
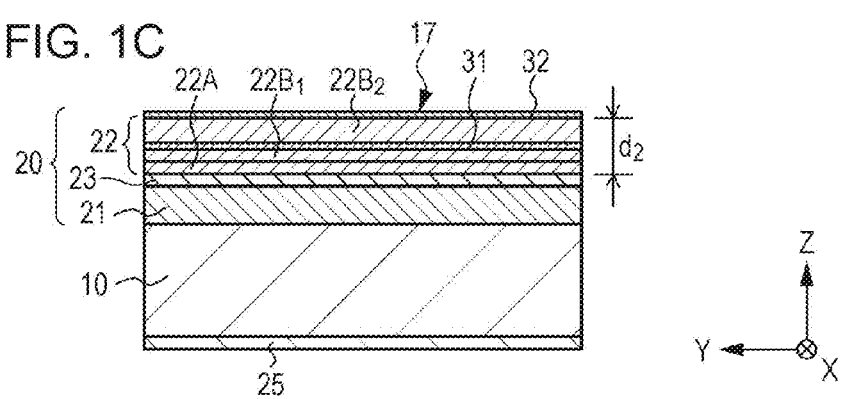

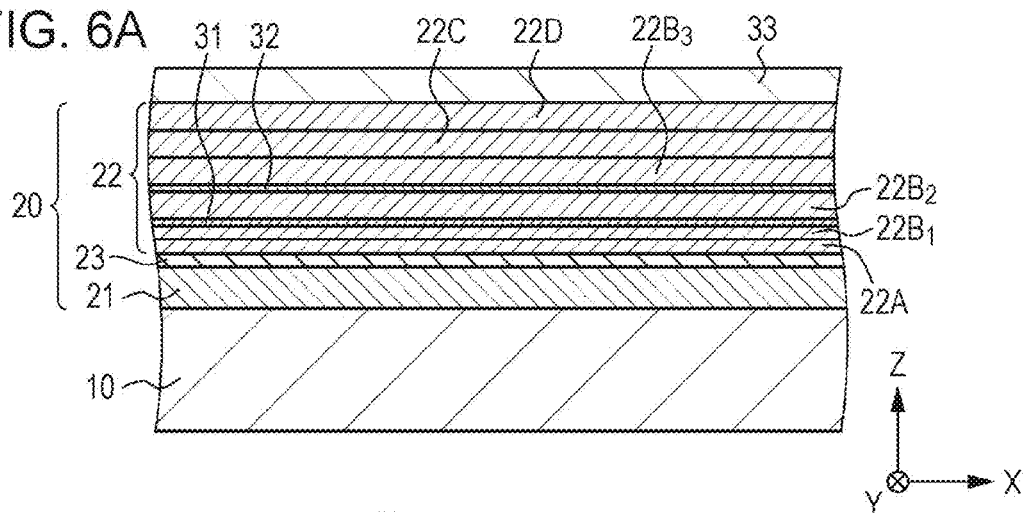
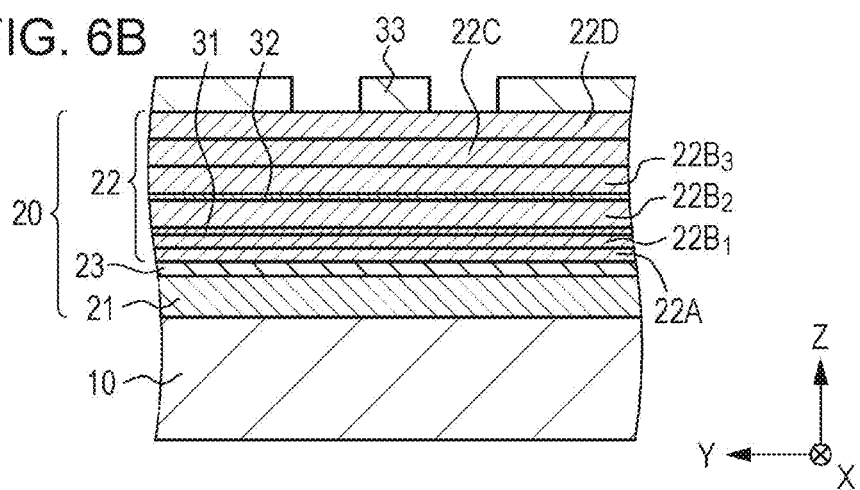
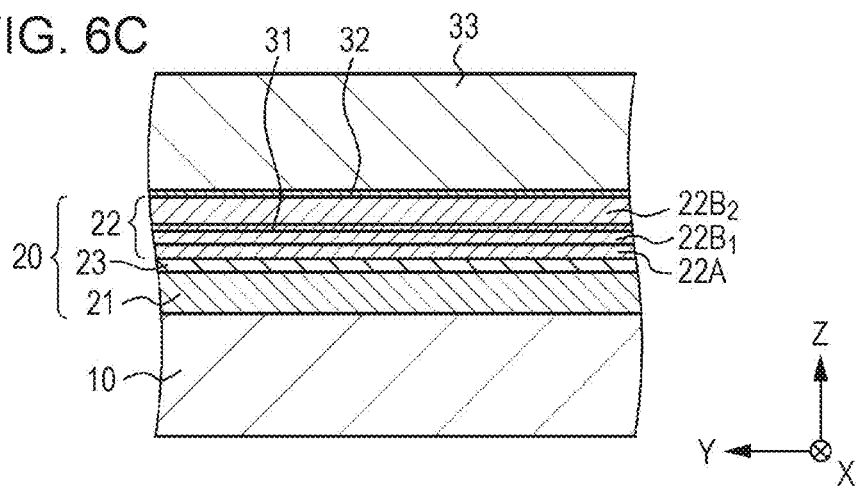

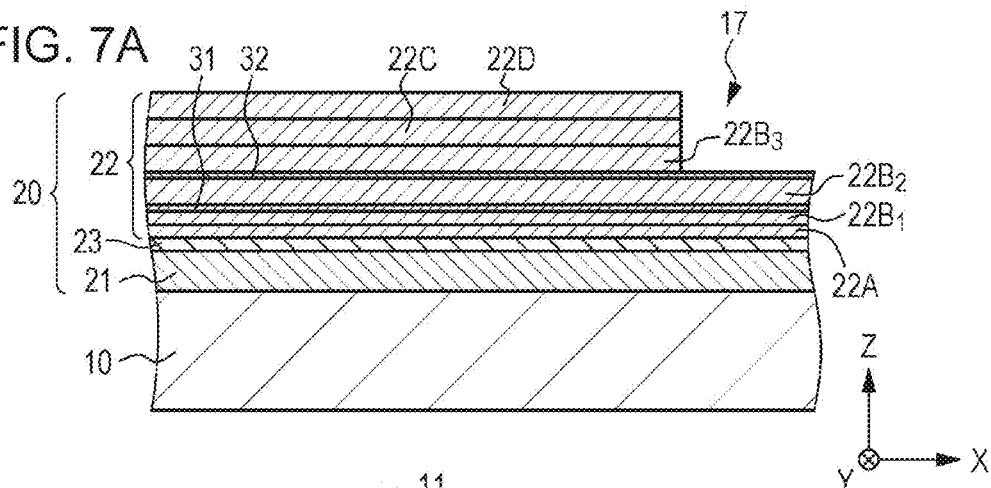
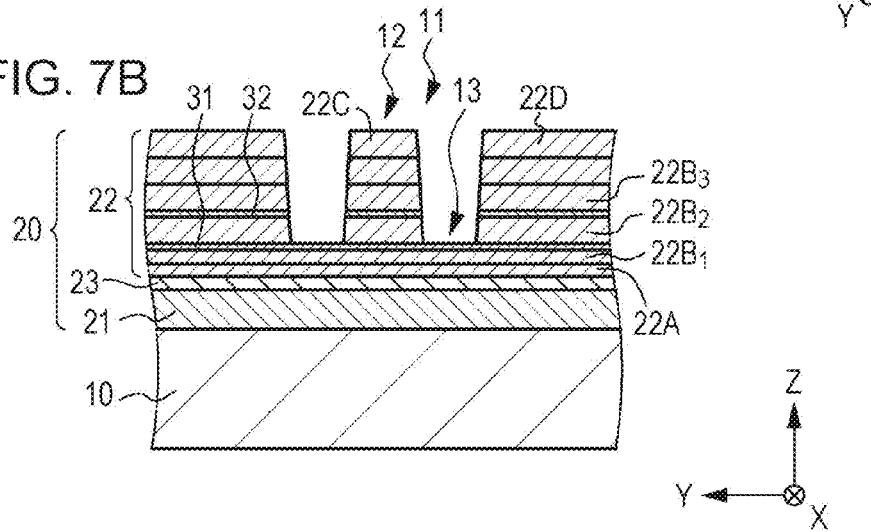
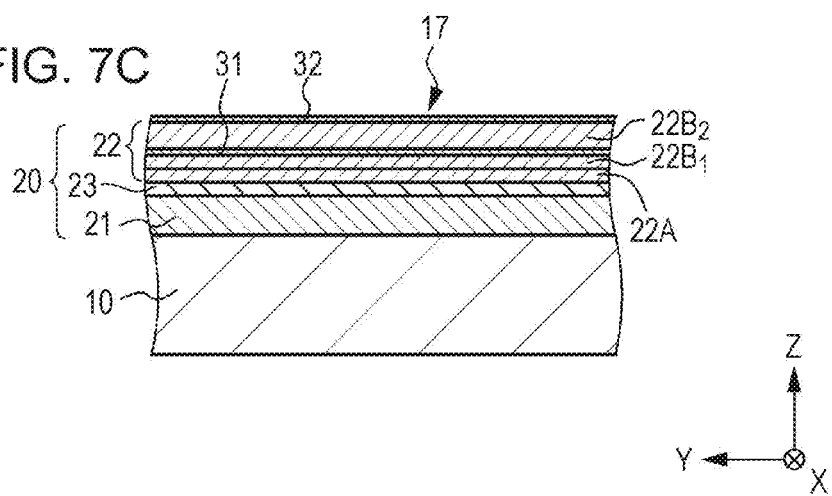

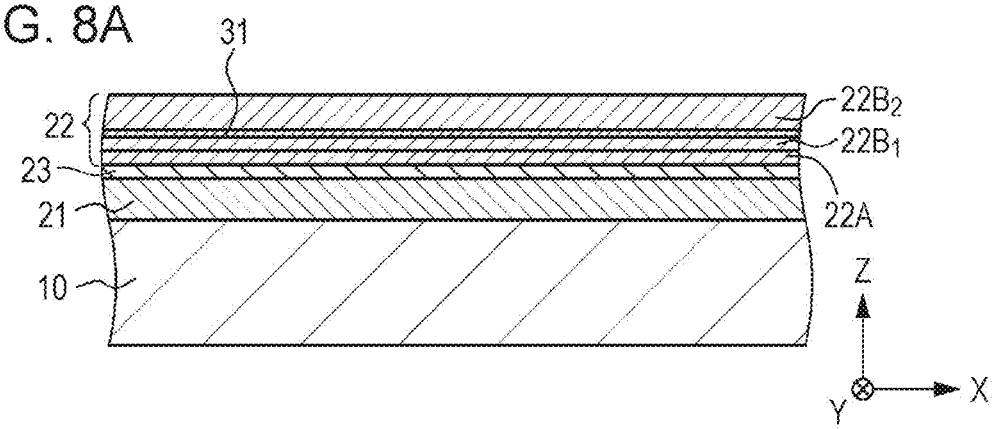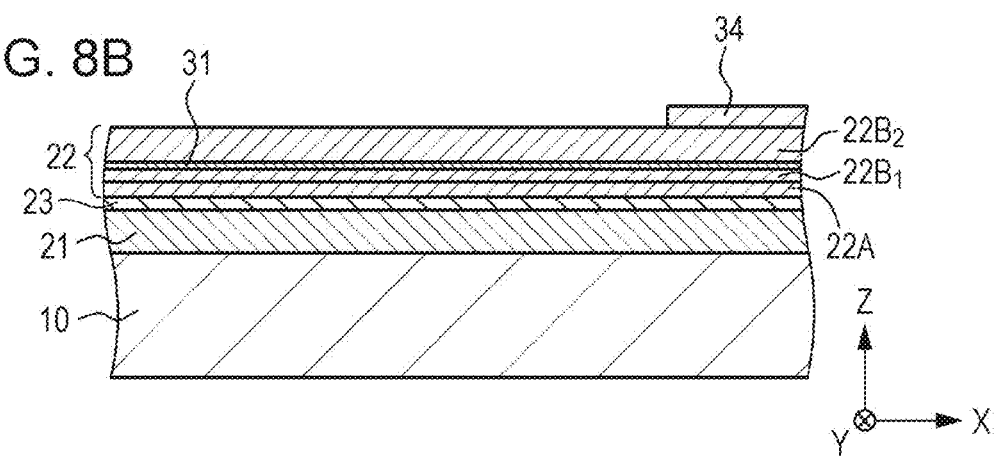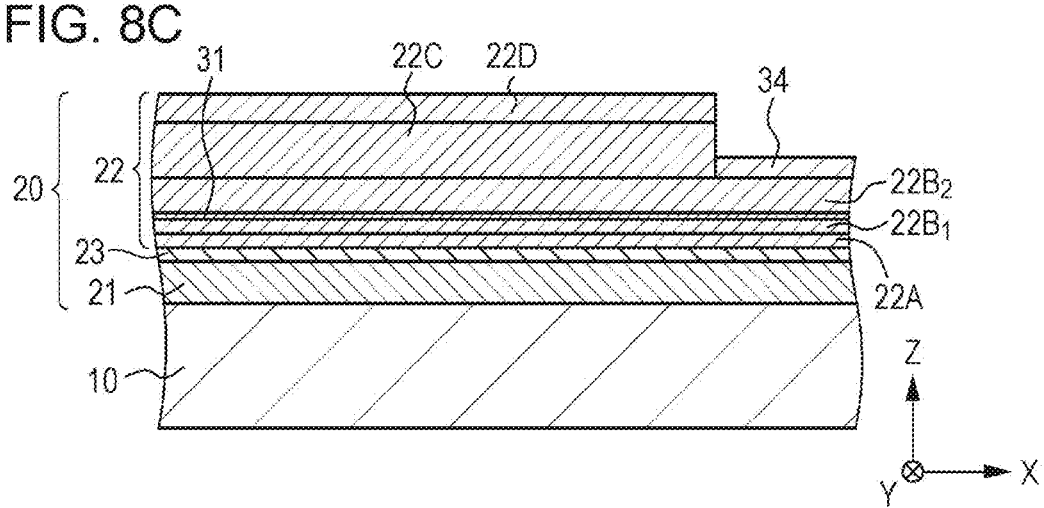

LIGHT EMITTING ELEMENT AND DISPLAY DEVICE INCLUDING A LIGHT-EMITTING REGION HAVING RIDGE STRIPE STRUCTURES

CROSS REFERENCE TO RELATED APPLICATIONS

This application claims the benefit of Japanese Priority Patent Application JP 2013-164884 filed Aug. 8, 2013, the entire contents of which are incorporated herein by reference.

BACKGROUND

The present disclosure relates to a light-emitting element, a manufacturing method thereof, and a display device including the light-emitting element.

For example, a so-called laser display device, that is, a display device referred to as a projector device, which includes a light-emitting element made from a semiconductor laser element as a light source, is well known from, for example, Japanese Unexamined Patent Application Publication No. 2009-025462. A laser display device has features of small size, light weight, and low power consumption in addition to high brightness and high definition, thereby attracting a lot of attention. However, in the laser display device, speckle noise becomes a factor which deteriorates an image quality of an image and a video. Speckle noise is a phenomenon that results from interference of scattered light on a laser irradiated surface displaying an image and a video such as a screen, a wall, and the like due to high coherence of a laser beam, and is caused by a presence of fine concavities and convexities on the laser irradiated surface.

A super luminescent diode (SLD) which has a structure similar to a semiconductor laser element, expands a spectrum width by suppressing a laser oscillation, and reduces coherence is attracting attention. The super luminescent diode has high directivity at the same level as a laser beam, and furthermore is a light-emitting element which can have a light spectrum as wide as a general light-emitting diode (LED).

For example, in Japanese Unexamined Patent Application Publication No. 2-310975, a super luminescent diode in which an end surface embedded region and a non-excitation region are formed in a vicinity of the light-emitting end surface by having a direction, in which a waveguide extends, perpendicular to a light-emitting end surface is disclosed as the related art in FIG. 3, a super luminescent diode with an oblique waveguide is disclosed in FIG. 4, and furthermore, problems of the super luminescent diode having these structures are indicated. Then, in order to solve these problems, by making the waveguide curved, a coupling coefficient of light to a waveguide is suppressed and induced emission is suppressed, thereby expanding a spectrum width.

SUMMARY

However, Japanese Unexamined Patent Application Publication No. 2-310975 discloses a technology which has a problem that a direction of emitted light is changed due to refraction of light on a light-emitting end surface since a waveguide is inclined with respect to the light-emitting end surface. Moreover, there is a problem that a radial shape of light emitted from the light-emitting end surface is curved (refer to FIG. 21B). Furthermore, in order to collect light using a lens in a display application, studies on lenses and an optical system is necessary. In order to solve these problems, as in the related art, a direction in which the waveguide extends may be, for example, perpendicular to the light-emitting end surface. However, when such a structure is adopted, a coupling coefficient of light to the waveguide is increased, so that induced emission is difficult to be suppressed. As a result, a spectrum width is narrowed, and speckle noise is not reduced any longer. In addition, a super luminescent diode which includes a current injection region, a current non-injection region, and a current injection end in which an amount of injected current is gradually decreased between the current injection region and the current non-injection region and is well known from Japanese Unexamined Patent Application Publication No. 2000-068553; however, has a problem that the super luminescent diode has a complicated structure.

Therefore, it is desirable to provide a light-emitting element which can reliably reduce speckle noise in spite of a simple structure, a manufacturing method thereof, and a display device which includes such a light-emitting element.

According to a first embodiment or a second embodiment of the present disclosure, there is provided a light-emitting element, including: a light-emitting region which is made from a stacked structure configured from a first compound semiconductor layer, an active layer, and a second compound semiconductor layer; and a light propagation region which is made from the stacked structure, extends from the light-emitting region, and has a light-emitting end surface, and in which the light-emitting region is configured from a ridge stripe structure and ridge stripe adjacent portions positioned at both sides of the ridge stripe structure.

In the light-emitting element according to the first embodiment of the present disclosure, when a thickness of the second compound semiconductor layer in the ridge stripe adjacent portions is set to $d_1$, a thickness of the second compound semiconductor layer in the light propagation region is set to $d_2$, and a thickness of the second compound semiconductor layer in the ridge stripe structure is set to $d_3$, $d_3 > d_2 > d_1$ is satisfied. In addition, the thickness of the second compound semiconductor layer means an average thickness from an interface between the active layer and the second compound semiconductor layer to a top surface of a predetermined region of the second compound semiconductor layer.

Moreover, in the light-emitting element according to the second embodiment of the present disclosure, when an effective refractive index of the light-emitting region is set to $n_{eff\text{-}1}$, and an effective refractive index of the light propagation region is set to $n_{eff\text{-}2}$, $|n_{eff\text{-}1} - n_{eff\text{-}2}| \leq 8 \times 10^{-4}$, preferably $|n_{eff\text{-}1} - n_{eff\text{-}2}| \leq 2 \times 10^{-5}$, is satisfied.

According to the first embodiment or a third embodiment of the present disclosure, there is provided a method of manufacturing a light-emitting element which is a method of manufacturing the light-emitting element according to the first embodiment of the present disclosure. Moreover, according to the second embodiment or a fourth embodiment of the present disclosure, there is provided a method of manufacturing a light-emitting element which is a method of manufacturing the light-emitting element according to the second embodiment of the present disclosure.

Then, the method of manufacturing a light-emitting element according to the first embodiment or the second embodiment of the present disclosure includes:

(a) forming successively the first compound semiconductor layer, the active layer, a first layer of the second compound semiconductor layer, a second layer of the second compound semiconductor layer, and a third layer of the second compound semiconductor layer; and (b) removing the third layer of the second compound semiconductor layer in a region for forming the light propagation region, and removing the third layer of the second compound semiconductor layer and the second layer of the second compound semiconductor layer in a region for forming ridge stripe adjacent portions.

In addition, a method of manufacturing a light-emitting element according to the third embodiment and the fourth embodiment of the present disclosure includes:

(a) forming successively the first compound semiconductor layer, the active layer, a first layer of the second compound semiconductor layer, and a second layer of the second compound semiconductor layer;

(b) forming a mask layer on the second layer of the second compound semiconductor layer in a region for forming the light propagation region;

(c) forming a third layer of the second compound semiconductor layer on the second layer of the second compound semiconductor layer in a region for forming the light-emitting region; and (d) removing the third layer of the second compound semiconductor layer and the second layer of the second compound semiconductor layer in a region for forming the ridge stripe adjacent portions.

According to another embodiment of the present disclosure, there is provided a display device, including the light-emitting element according to the first embodiment or the second embodiment of the present disclosure.

The light-emitting element according to the first embodiment or the second embodiment of the present disclosure includes a light-emitting region and a light propagation region which extends from the light-emitting region and has a light-emitting end surface. Accordingly, light from an active layer of the light-emitting region passes through the light propagation region, and most of the light is emitted to the outside of the system from the light-emitting end surface. In addition, the remainder of the light reaching the light-emitting end surface returns to the light propagation region; however, an amount of light returning to the active layer of the light-emitting region is extremely small. That is, a coupling coefficient of light to the active layer of the light-emitting region is low. Incidentally, light from the active layer of the light-emitting region is reflected even at an interface between the light-emitting region and the light propagation region. Then, as a difference $\Delta n_{eff}$ between an effective refractive index $n_{eff-1}$ of the light-emitting region and an effective refractive index $n_{eff-2}$ of the light propagation region becomes larger, more light is reflected at the interface between the light-emitting region and the light propagation region. In the light-emitting element according to the first embodiment of the present disclosure, a relationship among a thickness $d_1$ of the second compound semiconductor layer in the ridge stripe adjacent portions, a thickness $d_2$ of the second compound semiconductor layer in the light propagation region, and a thickness $d_3$ of the second compound semiconductor layer in the ridge stripe structure is defined. Moreover, in the light-emitting element according to the second embodiment of the present disclosure, a relationship between the effective refractive index $n_{eff-1}$ of the light-emitting region and the effective refractive index $n_{eff-2}$ of the light propagation region is defined. Therefore, it is possible to suppress reflection of light at the interface between the light-emitting region and the light propagation region. Thus, it is possible to further decrease a coupling coefficient of light to the active layer of the light-emitting region in spite of a simple structure, and to reliably suppress induced emission. As a result, it is possible to expand a spectrum width and to reduce speckle noise.

Moreover, an effect described in this specification is only an exemplification without being limited, and there may be additional effects.

BRIEF DESCRIPTION OF THE DRAWINGS

FIGS. 1A, 1B, and 1C are a schematic plan view of a stacked structure which configures a light-emitting element of Example 1, a schematic cross-sectional view of a stacked structure and the like taken along an arrow IB-IB in FIG. 1A, and a schematic cross-sectional view of a stacked structure and the like taken along an arrow IC-IC in FIG. 1A, respectively;

FIGS. 6A, 6B, and 6C, in succession to FIG. 5, are schematic partial cross-sectional views of the stacked structure and the like for describing the method of manufacturing the light-emitting element of Example 1;

FIGS. 7A, 7B, and 7C, in succession to FIGS. 6A, 6B, and 6C, are schematic partial cross-sectional views of the stacked structure and the like for describing the method of manufacturing the light-emitting element of Example 1;

FIGS. 8A, 8B, and 8C are schematic partial cross-sectional views of the stacked structure and the like for describing a method of manufacturing a light-emitting element of Example 2;

DETAILED DESCRIPTION OF EMBODIMENTS

Figure 2A:
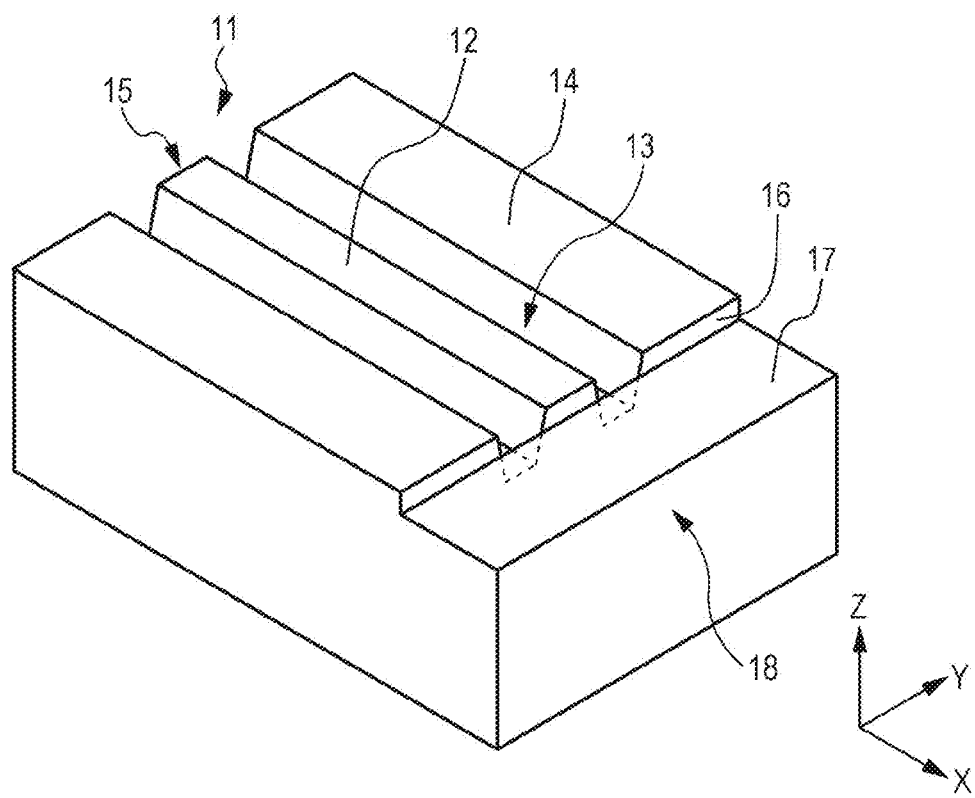
FIGS. 2A and 2B are a perspective view of the stacked structure and the like of the light-emitting element of Example 1 and a schematic cross-sectional view taken along an arrow IID-IID in FIG. 1A, respectively.

Embodiments as described below are preferred specific examples of the present disclosure, and various limitations which are technically preferable are applied thereto. However, in the following description, unless there is a statement that particularly limits the present disclosure, the scope of the present disclosure is not intended to be limited to these embodiments. The following description will be given in the order below.

1. Description of an entire light-emitting element according to a first embodiment and a second embodiment of the present disclosure, a method of manufacturing the light-emitting element according to the first embodiment to a fourth embodiment of the present disclosure, and a display device of the present disclosure.

2. Example 1 (the light-emitting element according to the first embodiment and the second embodiment of the present disclosure and a method of manufacturing the light-emitting element according to the first embodiment and a third embodiment of the present disclosure)

3. Example 2 (a method of manufacturing the light-emitting element according to the second embodiment and the fourth embodiment of the present disclosure) and others. [Description of the whole of the light-emitting element according to the first embodiment and the second embodiment of the present disclosure, a method of manufacturing a light-emitting element according to a first embodiment to a fourth embodiment of the present disclosure, and a display device of the present disclosure]

A method of manufacturing a light-emitting element according to the first embodiment or the second embodiment of the present disclosure is preferably realized in a form, in which, in a process (a), a first compound semiconductor layer, an active layer, a first layer of a second compound semiconductor layer, and a $2A^{th}$ layer of the second compound semiconductor layer, a first etching stop layer, a $2B^{th}$ layer of the second compound semiconductor layer, a second etching stop layer, a $2C^{th}$ layer of the second compound semiconductor layer, and a third layer of the second compound semiconductor layer are successively formed, and, in a process (b), the third layer of the second compound semiconductor layer and the $2C^{th}$ layer of the second compound semiconductor layer in a region for forming a light propagation region are removed, and the third layer of the second compound semiconductor layer, the $2C^{th}$ layer of the second compound semiconductor layer, the second etching stop layer, and the $2B^{th}$ layer of the second compound semiconductor layer in a region for forming ridge stripe adjacent portions are removed.

Moreover, a method of manufacturing the light-emitting element according to the third embodiment or the fourth embodiment of the present disclosure is preferably realized in a form in which, in the process (a), the first compound semiconductor layer, the active layer, a first layer of the second compound semiconductor layer, an etching stop layer, and a second layer of the second compound semiconductor layer are formed.

The light-emitting element according to the first embodiment of the present disclosure or a light-emitting element obtained by a method of manufacturing the light-emitting element according to the first embodiment or the third embodiment of the present disclosure including the above-mentioned preferable form is sometimes, hereinafter, collectively referred to as "the light-emitting element and the like according to the first embodiment of the present disclosure". In addition, the light-emitting element according to the second embodiment of the present disclosure or a light-emitting element obtained by a method of manufacturing the light-emitting element according to the second embodiment or the fourth embodiment of the present disclosure including the above-mentioned preferable form is sometimes, hereinafter, collectively referred to as "the light-emitting element and the like according to the second embodiment of the present disclosure". Furthermore, the light-emitting element and the like according to the first embodiment of the present disclosure and the light-emitting element and the like according to the second embodiment of the present disclosure are sometimes collectively referred to as "the light-emitting element and the like of the present disclosure". Moreover, a direction in which the ridge stripe structure extends is set to an X direction, a width direction of the active layer is set to a Y direction, and a thickness direction of the active layer is set to a Z direction.

The light-emitting element according to the first embodiment of the present disclosure is preferably realized in a form in which, when an effective refractive index of the light-emitting region is set to $n_{\textit{eff}-1}$ and an effective refractive index of the light propagation region is set to $n_{\textit{eff}-2}$, $|n_{\textit{eff}-1}-n_{\textit{eff}-2}| \leq 8 \times 10^{-4}$, preferably $|n_{\textit{eff}-1}-n_{\textit{eff}-2}| \leq 2 \times 10^{-5}$, can be satisfied.

A cross-sectional shape when cutting a ridge stripe structure with a XY plane can include a rectangular shape and an isosceles trapezoid shape, or can be also realized in a multi-stage shape (step-shape). When the cross-sectional shape is realized in the multi-stage shape, more specifically, for example, a width of a portion in which a thickness of the second compound semiconductor layer is $d_2$ can be wider than a width of a top surface of the second compound semiconductor layer, and a portion in which a thickness of the second compound semiconductor layer is $d_2$ can be realized in a form of protruding in the Y direction from a portion of the second compound semiconductor layer positioned higher than the portion.

The light-emitting element and the like of the present disclosure including the above-mentioned preferable form is preferably realized in a form in which a length $L_2$ of the light propagation region is 40 μm or more, preferably 40 μm to 200 μm. By setting the length $L_2$ of the light propagation region to 40 μm or more, a coupling coefficient which is obtained from Gaussian beam propagation calculations in the light propagation region and a reflectance at the interface between the light-emitting region and the light propagation region is about the same as a coupling coefficient (=about $1 \times 10^{-7}$) when a waveguide is inclined 5 degrees from a light-emitting end surface, and it is possible to further suppress a laser oscillation. Here, "coupling coefficient" refers to a ratio of (light returning to the active layer)/(light emitted from the active layer) when light emitted from the active layer to the light-emitting end surface is reflected at the interface between the light-emitting region and the light propagation region and on the light-emitting end surface, and returns to the active layer.

The light-emitting element and the like of the present disclosure including the above-mentioned various preferable forms is preferably realized in a form in which, when a width of the active layer at the interface between the light-emitting region and the light propagation region is set to $W_1$, and a length of the light propagation region is set to $L_2$, $20 \leq L_2/W_1 \leq 60$ is satisfied in terms of lowering further the coupling coefficient. The width $W_1$ of the active layer is not limited; however, it is possible to exemplify 1 μm to 2 μm.

Furthermore, the light-emitting element and the like of the present disclosure including the various preferable forms described above is preferably realized in a form in which the light-emitting region includes a light reflection end surface, a light reflectance on the light reflection end surface is 99% or more, and the light reflectance on the light-emitting end surface is 1% or less. When configuring the light-emitting element from a super luminescent diode as described below, light generated in the active layer is reflected on the light reflection end surface and emitted from the light-emitting end surface without configuring a resonator in the light-emitting element. On the light-emitting end surface, a non-reflection coating layer (AR) or a low-reflection coating layer is formed. In addition, on the light reflection end surface, a high-reflection coating layer (HR) is formed. The non-reflection coating layer (low-reflection coating layer) and the high-reflection coating layer can include a stacked structure of at least two types of layers which are selected from the group including a titanium oxide layer, a tantalum oxide layer, a zirconium oxide layer, a silicon oxide layer, an aluminum oxide layer, an aluminum nitride layer, and a silicon nitride layer, and can be formed based on a PVD method such as a sputtering method and a vacuum deposition method.

Furthermore, the light-emitting element and the like of the present disclosure including various preferable forms described above is preferably realized in a form in which a current is injected into the ridge stripe structure and a current is not injected into the light propagation region. Then, in this case, the first compound semiconductor layer can be electrically connected to a first electrode, and a second electrode is at least formed on a top surface of the stacked structure which configures the ridge stripe structure. The second electrode can be formed on a top surface of the stacked structure which configures the light propagation region; however, an insulation material layer may be formed between the top surface of the stacked structure which configures the light propagation region and the second electrode so that a current is not injected into the light propagation region.

The light-emitting element and the like of the present disclosure including various preferable forms described above can be realized in a configuration in which a compound semiconductor can be made from an AlGaInN-based compound semiconductor, and in this case, the light-emitting element can be made to emit blue color light or green color light. Alternatively, the light-emitting element and the like of the present disclosure including various preferable forms described above can be realized in a configuration in which a first etching stop layer and a second etching stop layer are formed in the stacked structure that configures the ridge stripe structure, the first etching stop layer is formed in the stacked structure that configures the light propagation region, and a top surface of the stacked structure that configures the light propagation region is configured from the second etching stop layer, and a top surface of a stacked structure that configures the ridge stripe adjacent portions is configured from the first etching stop layer. In this case, the compound semiconductor can be configured from AlGaInP-based compound semiconductor, and in this case, the light-emitting element can be made to emit red color light.

The light-emitting element and the like of the present disclosure including various preferable forms and configurations described above can be realized in a configuration in which a first dielectric film is formed at least on a side surface of the ridge stripe structure and a top surface of the ridge stripe adjacent portions, and a second dielectric film which is made from a material different from a material configuring the first dielectric film is formed on a top surface of the light propagation region. In this manner, by making the material configuring the first dielectric film and the material configuring the second dielectric film different from each other, it is possible to increase a degree of freedom for setting values of the effective refractive indexes $n_{eff-1}$ and $n_{eff-2}$ and a degree of freedom for setting values of $d_1$, $d_2$, and $d_3$. The first dielectric film and the second dielectric film can be configured from a single layer or a deposition film.

In the light-emitting element and the like of the present disclosure including various preferable forms and configurations described above, the ridge stripe structure can be realized in a form of being extended in a straight line shape. Then, in this case, as described above, when a direction in which the ridge stripe structure extends is set to an X direction, a width direction of the active layer is set to a Y direction, and a thickness direction of the active layer is set to a Z direction, a cut surface of the light-emitting end surface when cutting the light propagation region on a virtual XY plane including the active layer can be realized in a form of a straight line extending in the Y direction. That is, the light-emitting end surface can be realized in a form of being orthogonal to an X direction in which the ridge stripe structure extends (parallel to a YZ plane), or of being formed in a state of rotating about an axis parallel to the Y direction. The light-emitting end surface and the light reflection end surface are formed depending on a form of the light-emitting element, but are not necessarily formed by cleavage.

In the light-emitting element and the like of the present disclosure including various preferable forms and configurations described above, it is preferable that a half width of a light-emitting spectrum of light emitted from the light-emitting end surface be 1 nm or more, preferably, 4 nm or more. The half width of the light-emitting spectrum can be expanded by lengthening a length of the light-emitting region, and the half width of a specific light-emitting spectrum can be obtained by appropriately designing the length of the light-emitting region.

In the light-emitting element and the like of the present disclosure including various preferable forms and configurations described above, the light-emitting element can be realized in a form of being made from a super luminescent diode (SLD).

Moreover, examples of a display device of the present disclosure can include a projector device or an image display device having the light-emitting element as a light source, a monitoring device, a reflective type liquid crystal display device having the light-emitting element as a light source, a head mounted display (HMD), a head up display (HUD), and various illuminations. In addition, it is possible to use the light-emitting element of the present disclosure as a light source of a microscope.

In the light-emitting element and the like of the present disclosure including various preferable forms and configurations described above, as described above, a stacked structure configured from the first compound semiconductor layer, the active layer, and the second compound semiconductor layer can be realized in a form of being made from an AlGaInP-based compound semiconductor. In this case, the active layer can be realized in a form of including a quantum well structure in which a well layer made from a GaInP layer or an AlGaInP layer and a barrier layer made from the AlGaInP layer are stacked. Alternatively, a stacked structure configured from the first compound semiconductor layer, the active layer, and the second compound semiconductor layer can be realized in a form of being made from the AlGaInN-based compound semiconductor including GaN and AlGaN. In this case, the active layer can be realized in a form of including a quantum well structure in which a well layer made from the AlGaInN layer and a barrier layer made from the AlGaInN layer having a different In composition are stacked. A configuration of the stacked structure can be a well-known configuration as it is. The stacked structure is formed on a substrate, and has a structure in which the first compound semiconductor layer, the active layer, and the second compound semiconductor layer are stacked from a substrate side. The first electrode is connected to either the first compound semiconductor layer or the substrate, and the second electrode is connected to the second compound semiconductor layer.

In the following description, a region of a ridge stripe structure in the vicinity of an interface between the light-emitting region and the light propagation region is referred to as "a first region" for convenience, a region in the vicinity of a light reflection end surface of the ridge stripe structure is referred to as "a third region" for convenience, and a region of the ridge stripe structure interposed by the first region and the third region is referred to as "a second region" for convenience.

The ridge stripe structure may extend with a constant width, or may have a so-called flare structure. More specifically, a width $W_R$ of the ridge stripe structure can be the widest at an interface between the light-emitting region and the light propagation region, or can be the narrowest at the interface between the light-emitting region and the light propagation region depending on a necessary specification of the light-emitting element. In these cases, in a first region, it is possible to adopt a form in which (a-1) width $W_R$ gradually narrows towards a light reflection end surface.

(a-2) width $W_R$ is constant.

(a-3) width $W_R$ gradually expands towards the light reflection end surface.

In a third region, it is possible to adopt a form in which (b-1) width $W_R$ gradually narrows towards the light reflection end surface.

(b-2) width $W_R$ is constant.

(b-3) width $W_R$ gradually expands towards the light reflection end surface. In a second region, it is possible to adopt a form in which (c-1) width $W_R$ gradually narrows towards the light reflection end surface.

(c-2) width $W_R$ is constant.

(c-3) width $W_R$ gradually expands towards the light reflection end surface.

(c-4) width $W_R$ gradually narrows towards the light reflection end surface, and then becomes constant.

(c-5) width $W_R$ gradually narrows towards the light reflection end surface, and then gradually expands towards the light reflection end surface.

(c-6) width $W_R$ gradually narrows towards the light reflection end surface, and then becomes constant. Then, the width gradually expands towards the light reflection end surface.

(c-7) width $W_R$ gradually expands towards the light reflection end surface, and then becomes constant.

(c-8) width $W_R$ gradually expands towards the light reflection end surface, and then gradually narrows towards the light reflection end surface.

(c-9) width $W_R$ gradually expands towards the light reflection end surface, and then becomes constant. Then, the width gradually narrows towards the light reflection end surface. These forms of the first region, the second region, and the third region may be appropriately combined.

Examples of a substrate can include a GaN substrate, a GaAs substrate, a GaP substrate, an AlN substrate, an AlP substrate, an InN substrate, an InP substrate, an AlGaInN substrate, an AlGaN substrate, an AlInN substrate, an AlGaInP substrate, an AlGaP substrate, an AlInP substrate, a GaInP substrate, a ZnS substrate, a sapphire substrate, a SiC substrate, an alumina substrate, a ZnO substrate, a LiMgO substrate, a $LiGaO_2$ substrate, a $MgAl_2O_4$ substrate, a Si substrate, and a Ge substrate. Furthermore, it is possible to use a substrate in which a buffer layer and an intermediate layer are formed on a surface (main surface) of these substrates as a substrate. In addition, with respect to the main surface of these substrates, it is possible to use a crystal orientation surface which is called by a name of so-called A surface, B surface, C surface, R surface, M surface, N surface, S surface, and the like by a crystal structure (for example, a cubic crystal type, a hexagonal type, and the like), or a surface and the like in which these surfaces are turned off in a specific direction. In addition, it is possible to use a substrate that includes a crystal surface as a main surface, which can cleave an end surface of at least one of the light reflection end surface and the light-emitting end surface on a virtual plane rotated about an axis parallel to the above-described Y direction.

An n-type impurity which is added to a compound semiconductor layer configuring a stacked structure can include, for example, silicon (Si), germanium (Ge), selenium (Se), tin (Sn), carbon (C), tellurium (Te), sulfur (S), oxygen (O), and palladium (Pd). A P-type impurity can include lead (Zn), magnesium (Mg), beryllium (Be), cadmium (Cd), calcium (Ca), and barium (Ba). An active layer may have a single quantum well structure "QW structure", or may have a multiple quantum well structure "MQW structure". A method (deposition method) of forming the stacked structure can include a metal organic chemical vapor deposition method (MOCVD method, MOVPE method), a metal organic molecular beam epitaxy method (MOMBE method), a halogen hydride vapor phase epitaxy method (HYPE method) in which a halogen contributes to a transport or a reaction, and a plasma assisted physical vapor deposition method (PPD method). A method of etching a stacked structure to form a ridge stripe structure can include a combination of a lithography technology and a wet etching technology, and a combination of a lithography technology and a dry etching technology.

As a combination of (a material configuring the first dielectric film and a material configuring the second dielectric film), ($TiO_2$, $SiO_2$), ($TiO_2$, $Al_2O_3$), (AlN, $SiO_2$), (AlN, $Al_2O_3$), ($Ta_2O_5$, $SiO_2$), and ($Ta_2O_5$, $Al_2O_3$) can be exemplified.

The first etching stop layer and the second etching stop layer may be configured from, for example, a material which has a tolerance to wet etching by ammonia-hydrogen peroxide and the like, and, for example, $Ga_wIn_{1-w}P$ can be exemplified. The first etching stop layer and the second etching stop layer can be configured from the same material or can be configured from different materials. A thickness of the first etching stop layer and the second etching stop layer can be 5 nm as an example. The first etching stop layer and the second etching stop layer can be configured from a single layer, and can be configured from a deposition film.

A specific configuration of a mask layer (a selective growth mask layer) can include a silicon oxide layer ($SiO_x$ layer), a silicon nitride layer ($SiN_y$ layer), a SiON layer, a $Ta_2O_5$ layer, a $ZrO_2$ layer, an AlN layer, an $Al_2O_3$ layer, an oxide semiconductor layer or a nitride semiconductor layer referred to as a stacked structure of these layers (for example, a stacked structure of a silicon oxide layer and a silicon nitride layer from the bottom); a high melting point metal layer such as a nickel layer or a tungsten layer, a titanium layer, a gold layer, and a platinum layer; a layer configured from an alloy that these metals are adjusted in an appropriate composition (for example, TiW, TiWCr, TiWNi, NiCr, TiNiCr, or an alloy of these alloys and Au, or an alloy of these alloys and Pt); various high melting point metal (alloy) oxide layers; various high melting point metal (alloy) nitride layers; a multilayer film in which an alloy or these different metals, alloy oxide, and alloy nitride are combined; and a resist material layer. The mask layer can be formed based on a chemical vapor deposition method (CVD method) or a physical vapor deposition method (PVD method) such as a vacuum deposition method or a sputtering method, and a combination of a coating method and patterning by a lithography technology and an etching technology. The mask layer may be left or removed depending on a material configuration the mask layer. Depending on the material configuring the mask layer, as a method of removing the mask layer, the wet etching method may be adopted, the dry etching method may be adopted, or an asking technology may be used.

The stacked structure is connected to the first electrode and the second electrode. When forming the first electrode or the second electrode on a substrate or a compound semiconductor layer which has a P-type conductivity, such an electrode (p-side electrode) can include Au/AuZn, Au/Pt/Ti(/Au)/AuZn, Au/AuPd, Au/Pt/Ti(/Au)/AuPd, Au/Pt/TiW(/Ti)(/Au)/AuPd, Au/Pt/Ti, and Au/Ti. Moreover, when forming the first electrode or the second electrode on a substrate or a compound semiconductor layer which has an n-type conductivity, such an electrode (n-side electrode) can include Au/Ni/AuGe, Au/Pt/Ti(/Au)/Ni/AuGe, and Au/Pt/TiW(/Ti)/Ni/AuGe. A layer in front of "/" is positioned electrically further away from the active layer. The first electrode is electrically connected to a first compound semiconductor layer. However, a form in which the first electrode is formed on the first compound semiconductor layer and a form in which the first electrode is connected to the first compound semiconductor layer through a conductive material layer and a conductive substrate are included. A film can be formed on the first electrode and the second electrode by various PVD methods such as a vacuum deposition method and a sputtering method. A pad electrode may be provided on the first electrode and the second electrode so as to be electrically connected to an external electrode or a circuit. The pad electrode preferably has a single layer configuration or a multi-layer configuration which includes at least one type of metal selected from the group including titanium (Ti), aluminum (Al), platinum (Pt), gold (Au), and nickel (Ni). Alternatively, the pad electrode can be a multi-layer configuration exemplified by a multi-layer configuration of Ti/Pt/Au and a multi-layer configuration of Ti/Au.

In addition, when forming an electrode on a compound semiconductor layer which has p-type conductivity, a transparent conductive material layer may be formed between the electrode and the compound semiconductor layer which has the p-type conductivity. As a transparent conductive material which configures the transparent conductive material layer, Indium Tin Oxide (ITO; which includes Sn-doped $In_2O_2$, crystalline ITO, and amorphous ITO), indium zinc oxide (IZO), F-doped $In_2O_3$ (IFO), tin oxide ($SnO_2$), Sb-doped $SnO_2$ (ATO), F-doped $SnO_2$ (FTO), zinc oxide (ZnO; which includes Al-doped ZnO and B-doped ZnO) can be exemplified.

Example 1

Figure 2B:
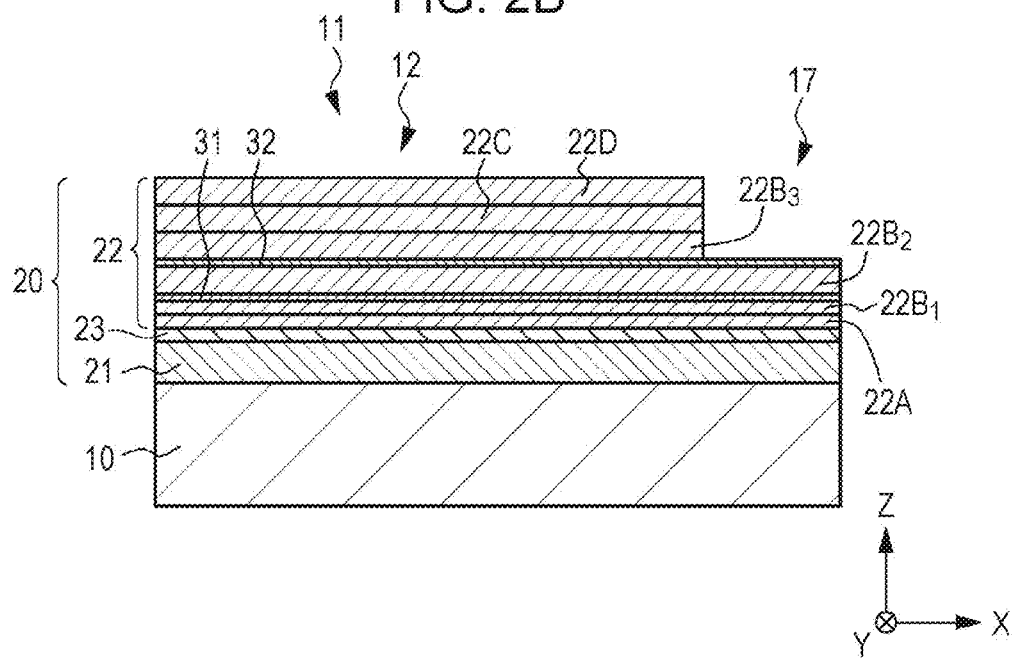
Figure 3:
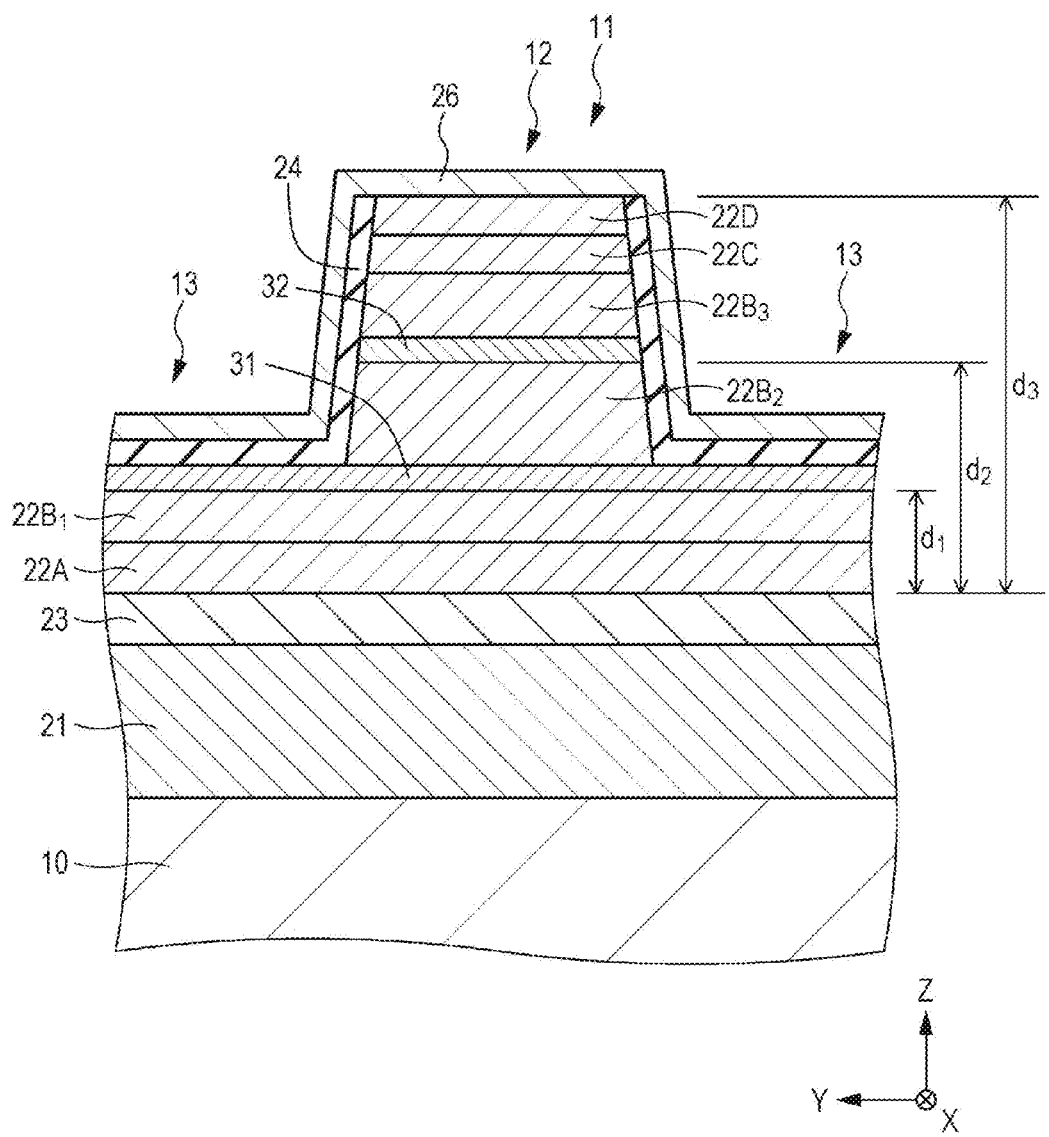
FIG. 3 is a schematic partial cross-sectional view of a light-emitting region of the light-emitting element of Example 1.
Figure 4:
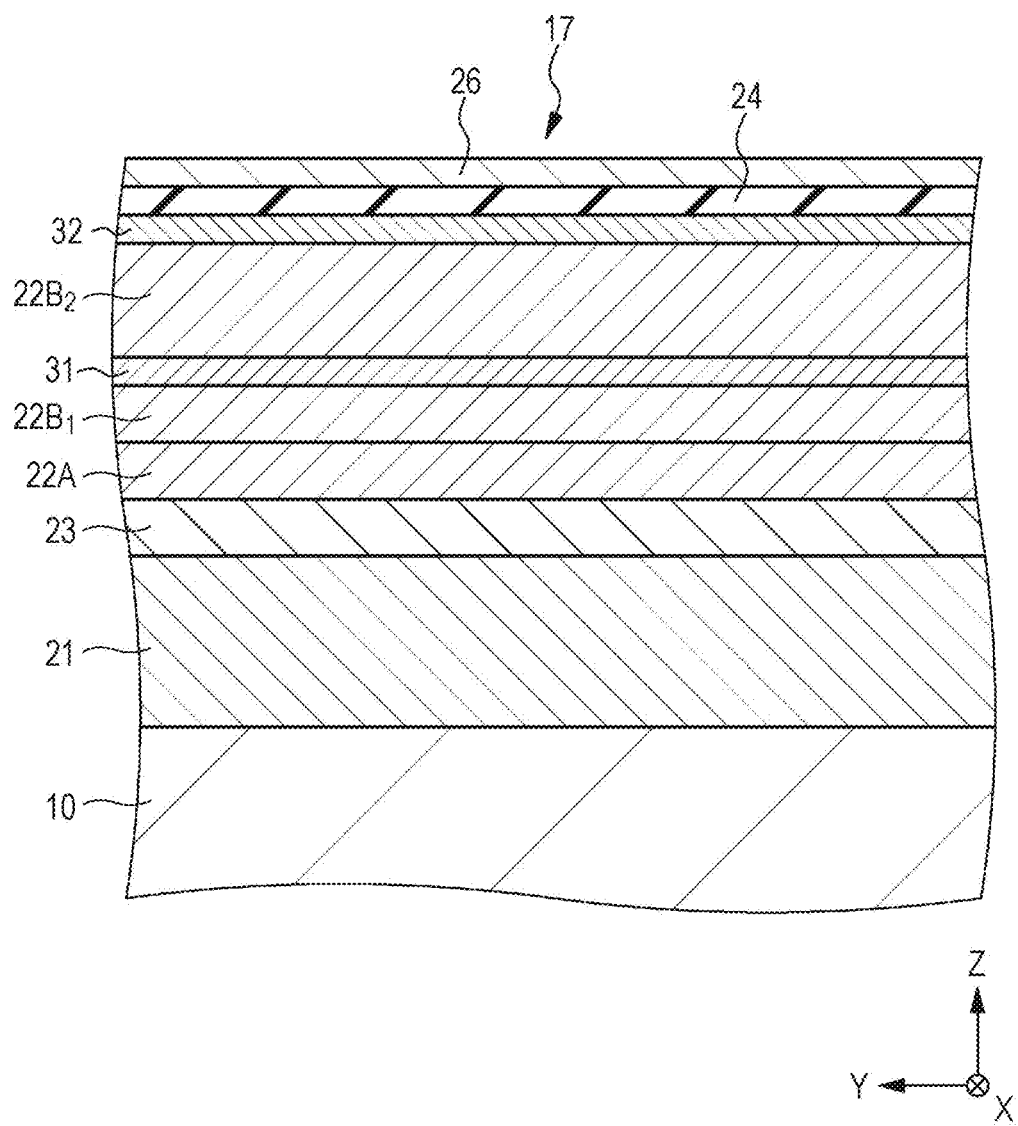
FIG. 4 is a schematic partial cross-sectional view of a light propagation region of the light-emitting element of Example 1.
Figure 5:
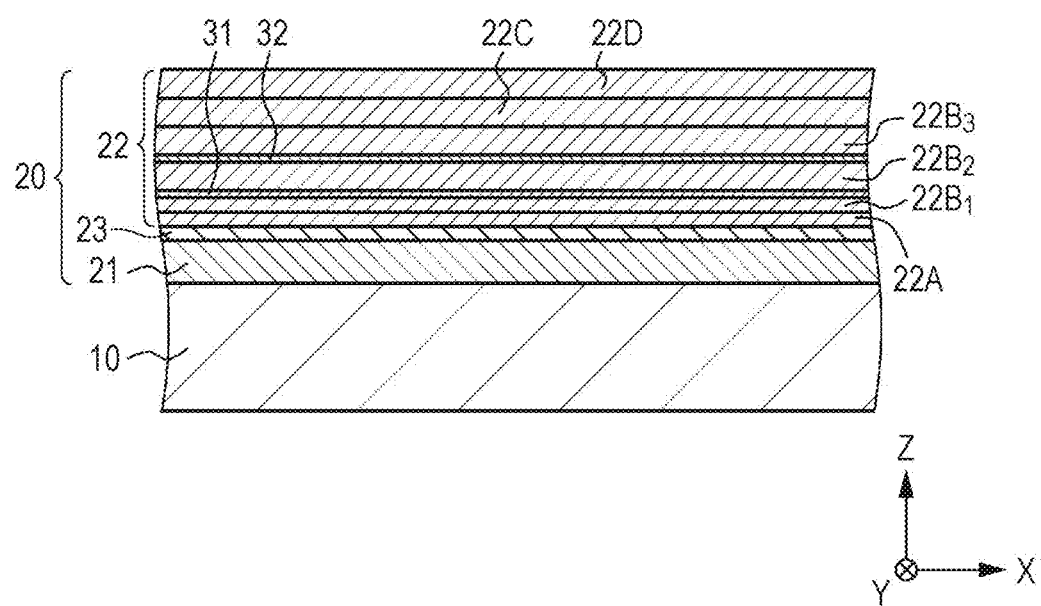
FIG. 5 is a schematic partial cross-sectional view of a stacked structure and the like for describing a method of manufacturing the light-emitting element of Example 1.

Example 1 relates to a light-emitting element according to a first embodiment and a second embodiment of the present disclosure, and a method of manufacturing the light-emitting element according to Example 1 and a third embodiment of the present disclosure. FIG. 1A shows a schematic plan view of a stacked structure configuring the light-emitting element of the first embodiment, FIG. 1B shows a schematic cross-sectional view of the stacked structure and the like taken along an arrow IB-IB in FIG. 1A, and FIG. 1C shows a schematic cross-sectional view of the stacked structure and the like taken along an arrow IC-IC in FIG. 1A. Furthermore, FIG. 2A shows a perspective view of the stacked structure and the like of the light-emitting element of Example 1, FIG. 2B shows a schematic cross-sectional view of the stacked structure taken along an arrow IIB-IIB in FIG. 1A, FIG. 3 shows a schematic partial cross-sectional view of a light-emitting region, and FIG. 4 shows a schematic partial cross-sectional view of a light propagation region.

More specifically, a light-emitting element (semiconductor light-emitting element) of Example 1 which is made from a super luminescent diode (SLD) and emits red color light includes a light-emitting region 11 which is made from a stacked structure 20 configured from a first compound semiconductor layer 21, an active layer 23, and a second compound semiconductor layer 22, and a light propagation region 17 which is made from the stacked structure 20, extends from the light-emitting region 11, and has a light-emitting end surface 18. The light-emitting region 11 is configured from a ridge stripe structure 12 and ridge stripe adjacent portions 13 positioned at both sides of the ridge stripe structure 12. More specifically, the stacked structure 20 is made from an AlGaInP-based compound semiconductor. Moreover, a reference number 14 indicates a portion of the stacked structure positioned outside the ridge stripe adjacent portions 13.

Then, when a thickness of the second compound semiconductor layer 22 in the ridge stripe adjacent portions 13 is set to $d_1$, a thickness of the second compound semiconductor layer 22 in the light propagation region 17 is set to $d_2$, and a thickness of the second compound semiconductor layer 22 in the ridge stripe structure 12 is set to $d_3$, $d_3 > d_2 > d_1$ is satisfied. When an effective refractive index of the light-emitting region 11 is set to $n_{eff-1}$, and an effective refractive index of the light propagation region 17 is set to $n_{eff-2}$, $|n_{eff-1} - n_{eff-2}| \leq 8 \times 10^{-4}$, preferably $|n_{eff-1} - n_{eff-2}| \leq 2 \times 10^{-5}$, is satisfied.

Then, in the stacked structure 20 which configures the ridge stripe structure 12, a first etching stop layer 31 and a second etching stop layer 32 are formed. Moreover, in the stacked structure 20 which configures the light propagation region 17, the first etching stop layer 31 is formed. Furthermore, a top surface of the stacked structure 20 which configures the light propagation region 17 is configured from the second etching stop layer 32. A top surface of the stacked structure 20 which configures the ridge stripe adjacent portions 13 is configured from the first etching stop layer 31. More specifically, the second compound semiconductor layer 22 is configured from a first layer 22A, a $2A^{th}$ layer $22B_1$, a $2B^{th}$ layer $22B_2$, and a $2C^{th}$ layer $22B_3$.

Then, the stacked structure 20 which configures the ridge stripe structure 12 is configured from the first compound semiconductor layer 21, the active layer 23, and the first layer 22A, the $2A^{th}$ layer $22B_1$, the $2B^{th}$ layer $22B_2$, the $2C^{th}$ layer $22B_3$ and third layers 22C and 22D of the second compound semiconductor layer 22. The first etching stop layer 31 is formed between the $2A^{th}$ layer $22B_1$ and the $2B^{th}$ layer $22B_2$ of the second compound semiconductor layer, and the second etching stop layer 32 is formed between the $2B^{th}$ layer $22B_2$ and the $2C^{th}$ layer $22B_3$ of the second compound semiconductor layer. Here, a thickness $d_3$ of the second compound semiconductor layer 22 in the ridge stripe structure 12 is a sum of thicknesses of the first layer 22A, the $2A^{th}$ layer $22B_1$, the first etching stop layer 31, the $2B^{th}$ layer $22B_2$, the second etching stop layer 32, the $2C^{th}$ layer $22B_3$, and the third layers 22C and 22D of the second compound semiconductor layer 22.

In addition, the stacked structure 20 which configures the light propagation region 17 is configured from the first compound semiconductor layer 21, the active layer 23, and the first layer 22A, the $2A^{th}$ layer $22B_1$, and the $2B^{th}$ layer $22B_2$ of the second compound semiconductor layer 22. The first etching stop layer 31 is formed between the $2A^{th}$ layer $22B_1$ and the $2B^{th}$ layer $22B_2$ of the second compound semiconductor layer, and the second etching stop layer 32 is positioned on a top surface of the $2B^{th}$ layer $22B_2$ of the second compound semiconductor layer. Here, the thickness $d_2$ of the second compound semiconductor layer in the light propagation region 17 is a sum of thicknesses of the first layer 22A, the $2A^{th}$ layer $22B_1$, the first etching stop layer 31, the $2B^{th}$ layer $22B_2$, and the second etching stop layer 32 of the second compound semiconductor layer 22.

Furthermore, the stacked structure 20 which configures the ridge stripe adjacent portions 13 is configured from the first compound semiconductor layer 21, the active layer 23, and the first layer 22A of the second compound semiconductor layer 22. The first etching stop layer 31 is positioned on a top surface of the $2A^{th}$ layer $22B_1$ of the second compound semiconductor layer. Here, the thickness $d_1$ of the second compound semiconductor layer in the ridge stripe adjacent portions 13 is a sum of thicknesses of the first layer 22A, the $2A^{th}$ layer $22B_1$ and the first etching stop layer 31 of the second compound semiconductor layer 22.

The first etching stop layer 31 and the second etching stop layer 32 are configured from a material which has a tolerance to wet etching using ammonia-hydrogen peroxide and the like, and more specifically is made from $Ga_wIn_{1-w}P$.

Specifically, the first compound semiconductor layer 21 is configured from a first cladding layer and a first light guide layer from a substrate side, and a buffer layer is formed between the substrate 10 and the first compound semiconductor layer 21. Moreover, the buffer layer is not illustrated, and the first compound semiconductor layer 21 is illustrated as one layer. The active layer 23 has a multiple quantum well structure, and has a quantum well structure in which a well layer made from a $Ga_sIn_{1-s}P$ layer or a $(Al_sGa_{1-s})_{0.5}In_{0.5}P$ layer and a barrier layer which is made from a $(Al_tGa_{1-t})_{0.5}In_{0.5}P$ layer are stacked. More specifically, the barrier layer is set to four layers and the well layer is set to three layers; however, the embodiment is not limited thereto. The first layer 22A of the second compound semiconductor layer configures a second light guide layer, the second layer 22 of the second compound semiconductor layer configures a second cladding layer, the third layer 22C of the second compound semiconductor layer configures a current spread layer, and the third layer 22D of the second compound semiconductor layer configures a contact layer.

The ridge stripe structure 12 extends with a constant width ($W_R$=1.7 μm) in an X direction in a straight line shape. A cut surface of the light-emitting end surface 18 when cutting the light propagation region 17 on a virtual XY plane including the active layer 23 is a straight line extending in a Y direction. That is, the light-emitting end surface 18 is orthogonal to the X direction in which the ridge stripe structure 12 extends. In other words, the light-emitting end surface 18 is perpendicular to (parallel to an YZ surface) the X direction in which the ridge stripe structure 12 extends. A cross-sectional shape when cutting the ridge stripe structure 12 on the XY plane is, for example, an isosceles trapezoid.

The light-emitting region 11 includes a light reflection end surface 15, and light reflectance on the light reflection end surface 15 is 99% or more, more specifically 99.9% or more. On the other hand, light reflectance on the light-emitting end surface 18 is 1% or less, more specifically 0.3% or less. A non-reflection coating layer (AR) or a low reflection coating layer is formed on the light-emitting end surface 18, and a high-reflection coating layer (HR) is formed on a light reflection end surface 15. However, these are not illustrated.

A current is injected into the ridge stripe structure 12, but no current is injected into the light propagation region 17. More specifically, the first compound semiconductor layer 21 is electrically connected to the first electrode 25 (more specifically, the first electrode 25 is formed on a back surface of the substrate 10 which is made from an n-GaAs substrate having conductivity), and a second electrode 26 is formed on a top surface of the stacked structure 20 which configures the ridge stripe structure 12, and a top surface of the stacked structure 20 which configures the light propagation region 17. The second electrode 26, specifically, is made from a multilayer film of a Ti layer with a thickness of 0.05 μm, a Pt layer with a thickness of 0.1 μm, and an Au layer with a thickness of 0.3 μm from a second compound semiconductor layer side. An insulation material layer (dielectric film 24) which is made from $SiO_2$ with a film thickness of 0.17 μm is formed between the top surface of the stacked structure 20 which configures the light propagation region 17 and the second electrode so that a current is not injected into the light propagation region 17. Moreover, the insulating material layer (dielectric film 24) is also formed on the stacked structure 20 which configures the light-emitting region 11. An opening is formed in the dielectric film 24 positioned on a top surface of the second compound semiconductor layer 22, and the second electrode 26 is in contact with the top surface of the second compound semiconductor layer 22 (more specifically, the third layer 22D of the second compound semiconductor layer corresponding to a contact layer) through the opening. Moreover, the second electrode 26 extends on the dielectric film 24. The second electrode is not illustrated In FIGS. 1B, 1C, 2A, and 2B, and the first electrode is not illustrated in FIGS. 2A and 2B.

A configuration of the stacked structure 20 which is made from an AlGaInP-based compound semiconductor in the light-emitting element (semiconductor light-emitting element) emitting red color light is shown in Table 1 below. A compound semiconductor layer described at the bottom is formed on the substrate 10.

TABLE 1

|  | Thickness | Composition |
|---|---|---|
| Second compound semiconductor layer 22 | | |
| Third layer (contact layer) 22D | | p-GaAs:Mg |
| Third layer 22C | | p-Ga$_v$In$_{1-v}$P:Mg |
| Second layer (second cladding layer) 22B | approximately 1.5 μm | p-Al$_{0.5}$In$_{0.5}$P:Mg |
| First layer (second light guide layer) 20A | approximately 40 nm | Ga$_u$In$_{1-u}$P |
| Active layer 23 | | |
| Well layer/barrier layer | | GaInP (thickness: 8 nm)/AlGaInP |
| First compound semiconductor layer 21 | | |
| First light guide layer | approximately 20 nm | Ga$_y$In$_{1-y}$P |
| First cladding layer | approximately 3 μm | n-(Al$_x$Ga$_{1-x}$)$_{0.5}$In$_{0.5}$P:Si |
| Buffer layer | | n-GaInP |

Figure 16:
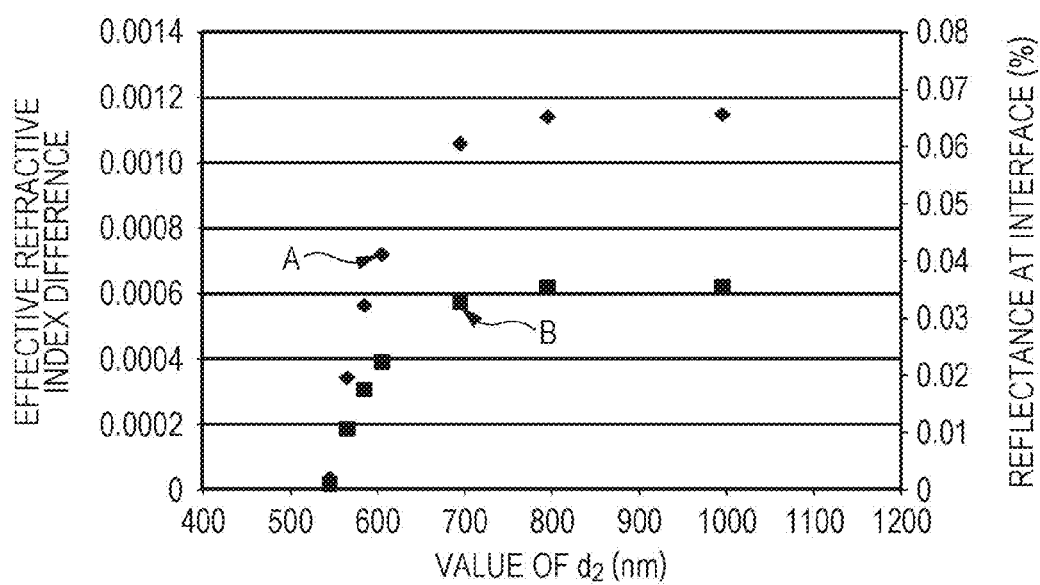
FIG. 16 is a graph which shows a thickness $d_2$ of a second compound semiconductor layer in a light propagation region, an effective refractive index difference between the light-emitting region and the light propagation region, and a result of obtaining reflectance at an interface between the light-emitting region and the light propagation region.

Various parameters in the light-emitting element of Example 1 are as shown in Table 2 below. In addition, values of effective refractive indexes $n_{\textit{eff}-1}$ and $n_{\textit{eff}-2}$ are shown in Table 2. Here, the effective refractive index can be obtained based on an equivalent refractive index method described in "Light Wave Engineering (Advanced Light Electronics Series 6)" written by Yasuo Kokubu, Kyoritsu Publication Co., Chapter 5, page 160 to page 162, and R. Ulrich and R. J. Martin: Appl. Opt., vol. 10, No. 9, pp 2077 to 2085, 1971. That is, when a configuration or a structure, and a thickness of the stacked structure 20, a material or a configuration, and a thickness of the dielectric film 24, a material or a configuration, and a thickness of the second electrode 25, a width of the ridge stripe structure 12 and the like in the light-emitting element are determined, it is possible to calculate a refractive index in the ridge stripe structure 12 having the second compound semiconductor layer with a thickness $d_3$, the ridge stripe adjacent portions 13 having the second compound semiconductor layer with a thickness $d_1$, and the light propagation region 17 having the second compound semiconductor layer with a thickness $d_2$ by calculating a distribution of light from a refractive index (using literature values) of a material forming respective layers and configuration elements. Then, it is possible to obtain an effective refractive index $n_{\textit{eff}-1}$ in the light-emitting region 11 based on a size (distance) of the ridge stripe structure 12 and the ridge stripe adjacent portions 13 in a width direction, and a refractive index of the ridge stripe structure 12 and the ridge stripe adjacent portions 13. A configuration and a structure of the light propagation region 17 in a width direction are the same, such that a refractive index of the light propagation region 17 is an effective refractive index $n_{\textit{eff}-2}$ in the light propagation region 17. FIG. 16 shows an effective refractive index difference when fixing a thickness $d_1$ of the second compound semiconductor layer in the light propagation region 17 to 495 nm and changing a thickness $d_2$ of the second compound semiconductor layer in the ridge stripe structure 12 (refer to a graph in a diamond shape of (A) in FIG. 16), and reflectance at an interface 16 between the light-emitting region 11 and the light propagation region 17 (refer to a graph in a square shape of (B) in FIG. 16).

TABLE 2

Figure 15:
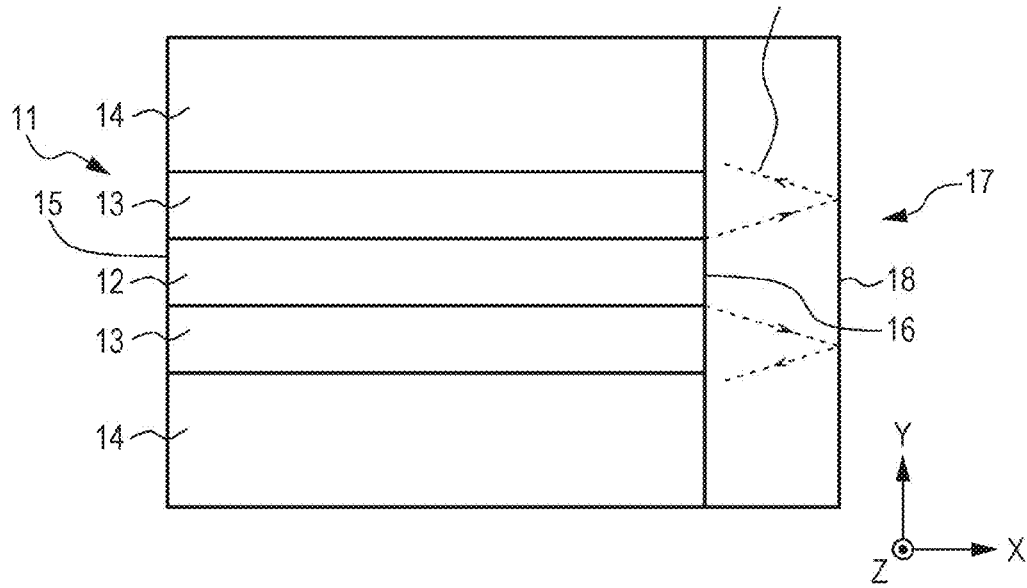
FIG. 15 is a schematic plan view of a stacked structure of a light-emitting element for describing that it is possible to decrease a coupling coefficient in the light-emitting element of the present disclosure.

$d_1$ = 0.225 μm
$d_2$ = 0.280 μm
$d_3$ = 1.52 μm
$W_1$ = 1.7 μm
$L_2$ = 40 μm
$n_{\textit{eff}-1}$ = 3.2272614
$n_{\textit{eff}-2}$ = 3.2272690
$n_{\textit{eff}-2} - n_{\textit{eff}-1}$ = 7.6 × 10$^{-6}$ As shown in a schematic plan view of the stacked structure of the light-emitting element of Example 1 in FIG. 15, most of the light emitted from the light-emitting region 11 is emitted from the light-emitting end surface 18; however, the remainder, even though it is slight, is reflected on the light-emitting end surface 18. Then, since the light propagation region 17 is present, only a portion of light reflected on the light-emitting end surface 18 returns to the light-emitting region 11 as shown in FIG. 15. Accordingly, it is possible to decrease a coupling coefficient.

Figure 17:
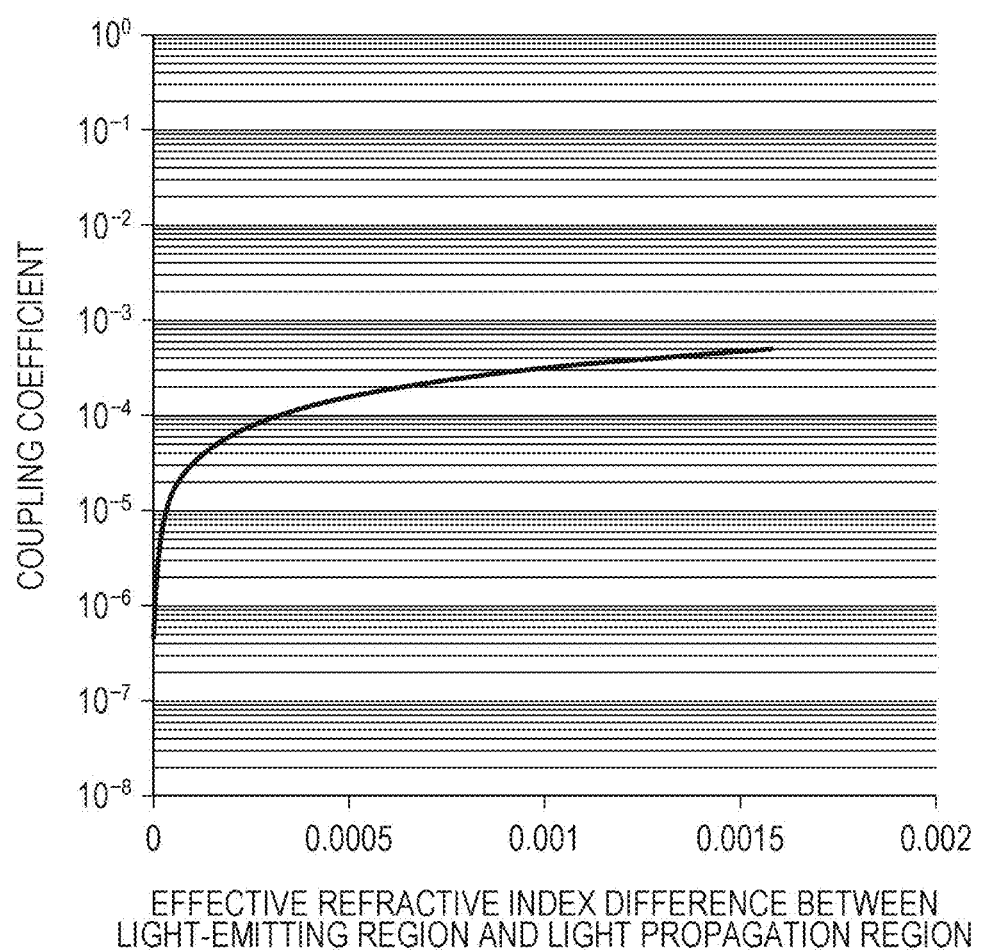
FIG. 17 is a graph which shows a relationship between the effective refractive index difference between the light-emitting region and the light propagation region and a coupling coefficient.
Figure 18A:
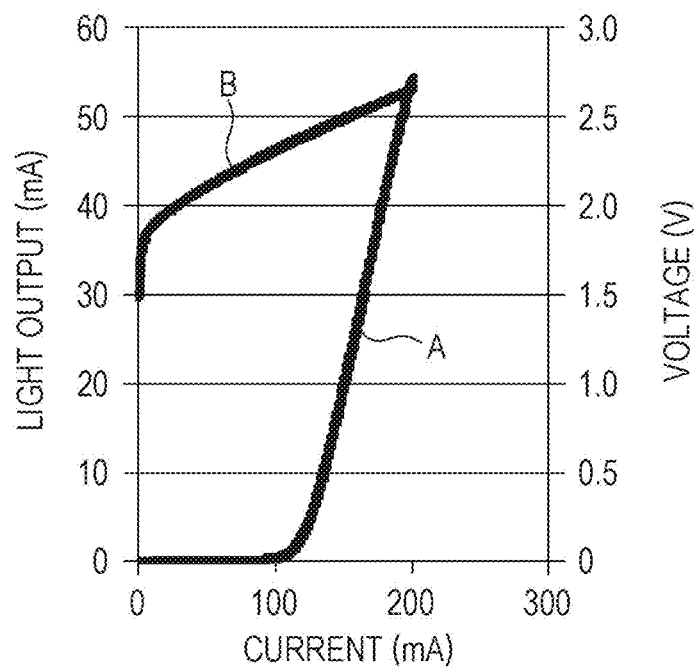
FIGS. 18A and 18B are a graph which shows a relationship between a driving current of the light-emitting element of Example 1, and a light output and an applied voltage, and a graph which shows a spectrum of light emitted from the light-emitting element of Example 1, respectively.
Figure 18B:
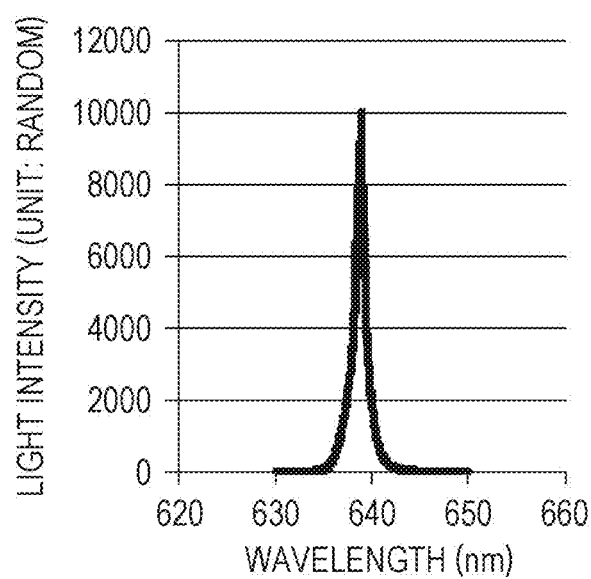
Figure 21A:
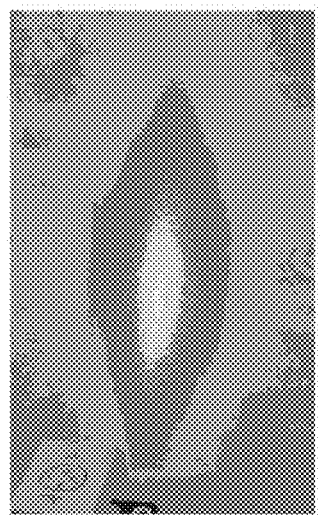
FIGS. 21A and 21B are a photograph which captures a radial shape of light emitted from the light-emitting element of Example 1, and a photograph which captures a radial shape of light emitted from a light-emitting element in which a waveguide is inclined to a light-emitting end surface of the related art, respectively.
Figure 21B:
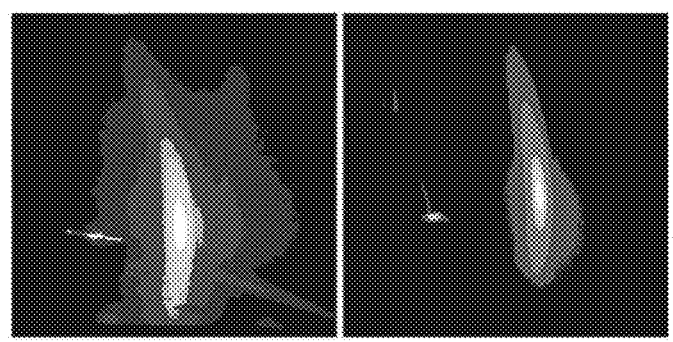

An effective refractive index difference between the light-emitting region 11 and the light propagation region 17 is very small, such that a coupling coefficient based on the parameter is 2×10$^{-6}$. In addition, reflectance at an interface 16 is about 6×10$^{-4}$%. A relationship between the effective refractive index difference between the light-emitting region 11 and the light propagation region 17, and a coupling coefficient is shown in a graph of FIG. 17. Furthermore, FIG. 18A shows a light output (refer to "A" of FIG. 18A) and a voltage (refer to "B" of FIG. 18A) when performing a continuous oscillation drive on the obtained light-emitting element of Example 1 until 200 milliamperes. Moreover, a spectrum when performing a constant current drive on the obtained light-emitting element of Example 1 with a current value at which a light output becomes 15 milliwatts is shown in FIG. 18B. In this case, 2 nm is obtained as a spectrum width. Furthermore, as shown in FIG. 21A, a radial shape of light emitted from the light-emitting end surface is not curved unlike in the related art shown in FIG. 21B.

Figure 19:
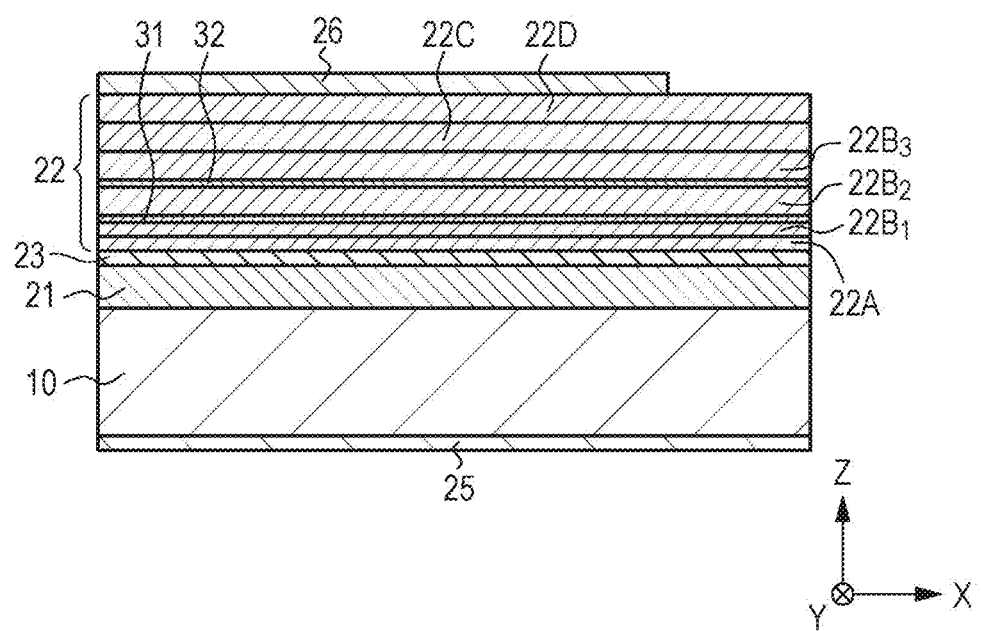
FIG. 19 is a schematic cross-sectional view of a light-emitting element of Comparative Example 1, which is the same as the view taken along an arrow IIB-IIB in FIG. 1A.
Figure 20A:
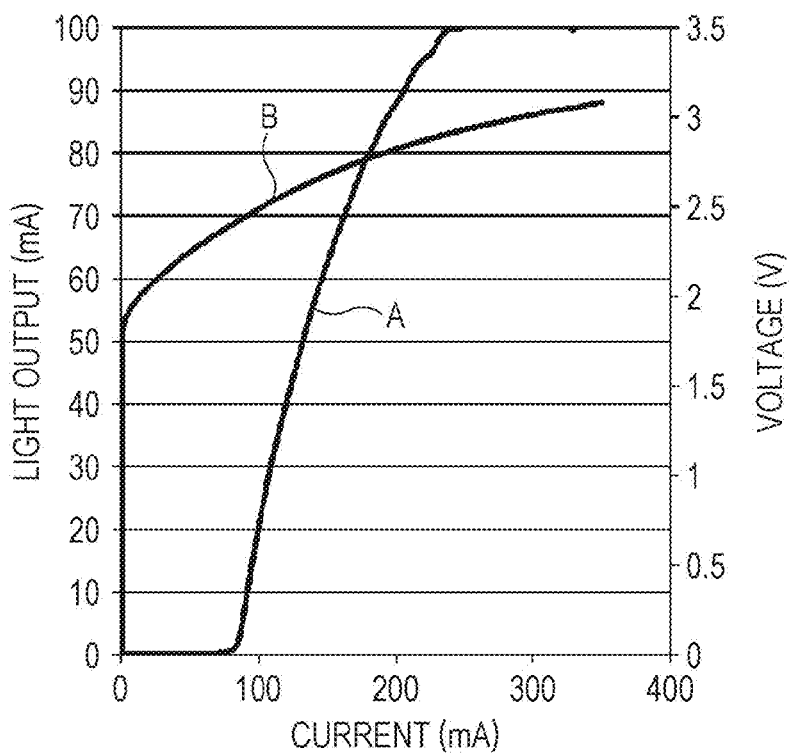
FIGS. 20A and 20B are a graph which shows a relationship between a driving current of the light-emitting element of Comparative Example 1, and a light output and an applied voltage, and a graph which shows a spectrum of light emitted from the light-emitting element of Comparative Example 1, respectively.
Figure 20B:
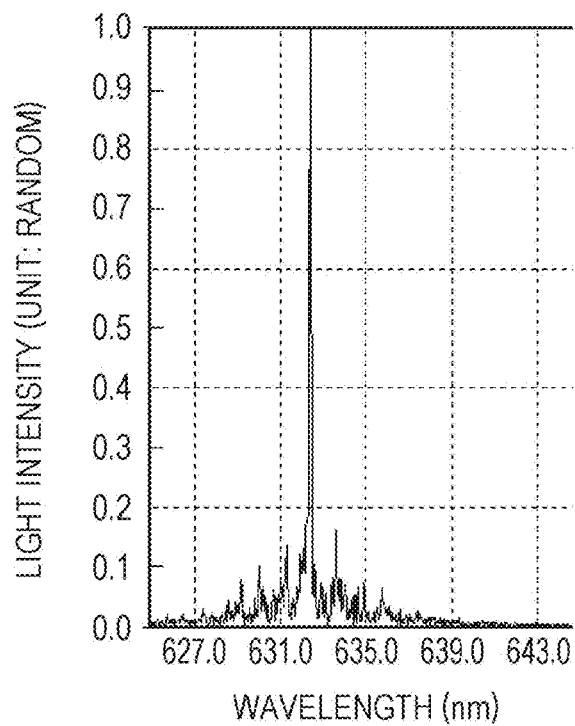

A light-emitting element in which a structure of a stacked structure in the light propagation region 17 is made to be the same as a structure of a stacked structure in the light-emitting region 11 is tried and made as a light-emitting element of Comparative Example 1. A schematic cross-sectional view of the light-emitting element of Comparative Example 1 which is the same as the view taken along an arrow IIB-IIB in FIG. 1A is shown in FIG. 19. An effective refractive index n'$_{\textit{eff}-2}$ in the light propagation region 17 of the light-emitting element of Comparative Example 1 is n'$_{\textit{eff}-2}$=3.2285759. Here, an effective refractive index $n_{\textit{eff}-1}$ of the light-emitting region 11 of the light emitting element of Comparative Example 1 is the same as an effective refractive index $n_{\textit{eff}-1}$ of the light-emitting region 11 of the light-emitting element of Example 1. Accordingly, n'$_{\textit{eff}-2}$−$n_{\textit{eff}-1}$=1.3145×10$^{-3}$, and reflectance at an interface is about 4×10$^{-2}$%, and increases in an order of 10$^2$ compared to Example 1, so that laser oscillation is difficult be suppressed. FIG. 20A shows a light output (refer to "A" of FIG. 20A) and a voltage (refer to "B" of FIG. 20A) when performing a continuous oscillation drive on the obtained light-emitting element of Comparative Example 1. Moreover, a spectrum when performing a constant current drive on the obtained light-emitting element of Comparative Example 1 with a current value at which a light output becomes 15 milliwatts is shown in FIG. 20B; however, a spectrum width is about 0.1 nm.

Hereinafter, referring to FIGS. 5, 6A, 6B, 6C, 7A, 7B, and 7C which are schematic partial cross-sectional views of a stacked structure and the like, a method of manufacturing the light-emitting element of Example 1 will be described.

Process-100

First of all, the buffer layer, the first compound semiconductor layer 21, the active layer 23, and the second compound semiconductor layer 22 (the first layer 22A of the second compound semiconductor layer, the second layer 22B of the second compound semiconductor layer, and the third layers 22C and 22D of the second compound semiconductor layer) are successively formed on the substrate 10, made from n-GaAs substrate, based on a well-known MOCVD method. More specifically, the first compound semiconductor layer 21, the active layer 23, the first layer 22A of the second compound semiconductor layer, the $2A^{th}$ layer $22B_1$ of the second compound semiconductor layer, the first etching stop layer 31, the $2B^{th}$ layer $22B_2$ of the second compound semiconductor layer, the second etching stop layer 32, the $2C^{th}$ layer $22B_3$ of the second compound semiconductor layer, and the third layers 22C and 22D of the second compound semiconductor layer are successively formed (refer to FIG. 5). Then, a heat treatment and the like are performed using an existing method. With regard to composition and the like, Table 1 and Table 2 are referred to.

Then, the third layers 22C and 22D of the second compound semiconductor layer in a region for forming the light propagation region 17 are removed, and the third layers 22C and 22D of the second compound semiconductor layer and the second layer 22B of the second compound semiconductor layer in a region for forming the ridge stripe adjacent portions 13 are removed. Specifically, the third layers 22C and 22D of the second compound semiconductor layer and the $2C^{th}$ layer $22B_3$ of the second compound semiconductor layer in a region for forming the light propagation region 17 are removed, and the third layers 22C and 22D of the second compound semiconductor layer, the $2C^{th}$ layer $22B_3$ of the second compound semiconductor layer, the second etching stop layer 32 and the $2B^{th}$ layer $22B_2$ of the second compound semiconductor layer in a region for forming the ridge stripe adjacent portions 13 are removed.

Process-110

More specifically, an etching resist layer 33 is formed on an entire surface, and an opening is formed on a portion of the etching resist layer 33 in a region for forming the ridge stripe adjacent portions 13 based on a photolithography technology. Accordingly, it is possible to obtain the structure shown in FIGS. 6A, 6B, and 6C. FIG. 6A or FIG. 7A to be described below is a schematic cross-sectional view which is the same as the view taken along an arrow IIB-IIB in FIG. 1A, FIG. 6B or FIG. 7B to be described below is a schematic cross-sectional view which is the same as the view taken along an arrow IB-IB in FIG. 1A, and FIG. 6C or FIG. 7C to be described below is a schematic cross-sectional view which is the same as the view taken along an arrow IC-IC in FIG. 1A. Then, by performing wet etching on the stacked structure 20, the stacked structure 20 in the ridge stripe adjacent portions 13 is removed. Specifically, by performing wet etching on the third layers 22D and 22C of the second compound semiconductor layer which configures the stacked structure 20, the $2C^{th}$ layer $22B_3$ of the second compound semiconductor layer, the second etching stop layer 32, and the $2B^{th}$ layer $22B_2$ of the second compound semiconductor layer, etching in the first etching stop layer 31 is stopped. Thereafter, the etching resist layer 33 is removed.

Process-120

Next, the light-emitting region 11 is covered, and the etching resist layer having an opening at a portion of a region for forming the light propagation region 17 is formed. Then, by performing wet etching on the stacked structure 20, the stacked structure 20 in the light propagation region 17 is removed. Specifically, etching on the second etching stop layer 32 is stopped by performing wet etching on the third layers 22D and 22C of the second compound semiconductor layer which configure the stacked structure 20 to the $2C^{th}$ layer $22B_3$ of the second compound semiconductor layer. Thereafter, the etching resist layer is removed. Accordingly, it is possible to obtain the structure shown in FIGS. 7A, 7B, and 7C.

Process-130

Thereafter, an insulating material layer (dielectric film) 24 is formed on an entire surface based on, for example, a CVD method, and a portion of an insulating material layer 24 positioned on a top surface of the second compound semiconductor layer 22 is removed. Then, the second electrode 26 is formed on the entire surface. Next, the substrate 10 is made to be thin to a predetermined thickness and the first electrode 25 made from, for example, Au/Ni/AuGe (AuGe is in contact with the substrate 10) is formed on a surface of the substrate 10. Then, it is possible to obtain the light-emitting element of Example 1 by performing element separation.

As described above, the light-emitting element of Example 1 includes a light-emitting region and a light propagation region which extends from the light-emitting region and has a light-emitting end surface. Accordingly, a portion of light reaching the light-emitting end surface returns to the light propagation region; however, an amount of light returning to the active layer of the light-emitting region is very small, so that it is possible to decrease a coupling coefficient. In addition, since a relation among a thickness $d_1$ of the second compound semiconductor layer in the ridge stripe adjacent portions, a thickness $d_2$ of the second compound semiconductor layer in the light propagation region, and a thickness $d_3$ of the second compound semiconductor layer in the ridge stripe structure is defined, and a relation between the effective refractive index $n_{eff-1}$ in the light-emitting region and the effective refractive index $n_{eff-2}$ in the light propagation region is defined, it is possible to suppress reflection of light at an interface between the light-emitting region and the light propagation region, and to further decrease a coupling coefficient. As a result of the above, in spite of a simple structure, it is possible to suppress induced emission, and thereby a spectrum width can be expanded and speckle noise can be reduced. Moreover, the light-emitting end surface is orthogonal to an X direction in which the ridge stripe structure extends. In other words, the light-emitting end surface is perpendicular (parallel to an YZ surface) to an X direction in which the ridge stripe structure extends. Accordingly, a radiant intensity distribution becomes a Gaussian distribution in a horizontal direction and a vertical direction of the light-emitting element, and light collection by a lens is easy, so that a design of an optical system becomes easy. Moreover, a problem that a radial shape of light emitted from the light-emitting end surface is curved does not occur. As a result of the above, the light-emitting element of Example 1 can be very easily applied to, for example, a display device.

Example 2

Example 2 is a modification of Example 1, and relates to a method of manufacturing a light-emitting element according to the second embodiment and the fourth embodiment of the present disclosure. A light-emitting element obtained by the method of manufacturing a light-emitting element of Example 2 has substantially the same configuration and structure as the light-emitting element described in Example 1.

Hereinafter, the method of manufacturing the light-emitting element of Example 2 will be described referring to FIGS. 8A, 8B, and 8C which are schematic partial cross-sectional views of a stacked structure and the like which are the same as the view taken along an arrow IIB-IIB in FIG. 1A.

Process-200

First, the buffer layer, the first compound semiconductor layer 21, the active layer 23, the first layer 22A of the second compound semiconductor layer, and the second layer 22B of the second compound semiconductor layer are successively formed on the substrate 10 made from an n-GaAs substrate based on a well-known MOCVD method. More specifically, the first compound semiconductor layer 21, the active layer 23, the first layer 22A of the second compound semiconductor layer, the $2A^{th}$ layer $22B_1$ of the second compound semiconductor layer, the etching stop layer 31, and the $2B^{th}$ layer $22B_2$ of the second compound semiconductor layer are successively formed (refer to FIG. 8A).

Process-210

Next, a mask layer (selective growth mask layer) 34 is formed on the second layer 22B of the second compound semiconductor layer in a region for forming the light propagation region 17 (refer to FIG. 8B). Specifically, by forming a mask layer made from $SiO_2$ on an entire surface based on a CVD method, and patterning the mask layer based on a photolithography technology and an etching technology, it is possible to form a mask layer (selective growth mask layer) 34.

Process-220

Thereafter, the third layers 22C and 22D of the second compound semiconductor layer are formed on the second layer 22B of the second compound semiconductor layer in a region for forming the light-emitting region 11. More specifically, the third layers 22C and 22D of the second compound semiconductor layer are formed on the $2B^{th}$ layer $22B_2$ of the second compound semiconductor layer in the region for forming the light-emitting region 11 not covered by the mask layer 34 based on a MOCVD method (refer to FIG. 8C).

Process-230

Next, the third layers 22C and 22D of the second compound semiconductor layer in a region for forming the ridge stripe adjacent portions 13 and the second layer 22B of the second compound semiconductor layer are removed. More specifically, by forming an etching resist layer on the entire surface, an opening is formed on a portion of an etching resist layer of the region for forming the ridge stripe adjacent portions 13 based on a photolithography technology. Then, by performing wet etching on the stacked structure 20, the stacked structure 20 in the ridge stripe adjacent portions 13 is removed. Specifically, etching in the etching stop layer 31 is stopped by performing wet etching on the third layers 22D and 22C of the second compound semiconductor layer which configures the stacked structure 20, and the $2B^{th}$ layer $22B_2$ of the second compound semiconductor layer. Thereafter, the etching resist layer is removed, and furthermore the mask layer 34 is removed.

Process-240

Next, it is possible to obtain the light-emitting element of Example 2 by performing a process the same as "Process-120" and "Process-130" of Example 1.

In addition, in Example 2, a thickness $d_3$ of the second compound semiconductor layer 22 in the ridge stripe structure 12 is a sum of thicknesses of the first layer 22A, the $2A^{th}$ layer $22B_1$, the etching stop layer 31, the $2B^{th}$ layer $22B_2$, and the third layers 22C and 22D of the second compound semiconductor layer 22. In addition, a thickness $d_2$ of the second compound semiconductor layer in the light propagation region 17 is a sum of thicknesses of the first layer 22A, the $2A^{th}$ layer $22B_1$, the etching stop layer 31, and the $2B^{th}$ layer $22B_2$ of the second compound semiconductor layer 22. Furthermore, a thickness $d_1$ of the second compound semiconductor layer in the ridge stripe adjacent portions 13 is a sum of thicknesses of the first layer 22A, the $2A^{th}$ layer $22B_1$ and the etching stop layer 31 of the second compound semiconductor layer 22.

Example 3

Figure 9:
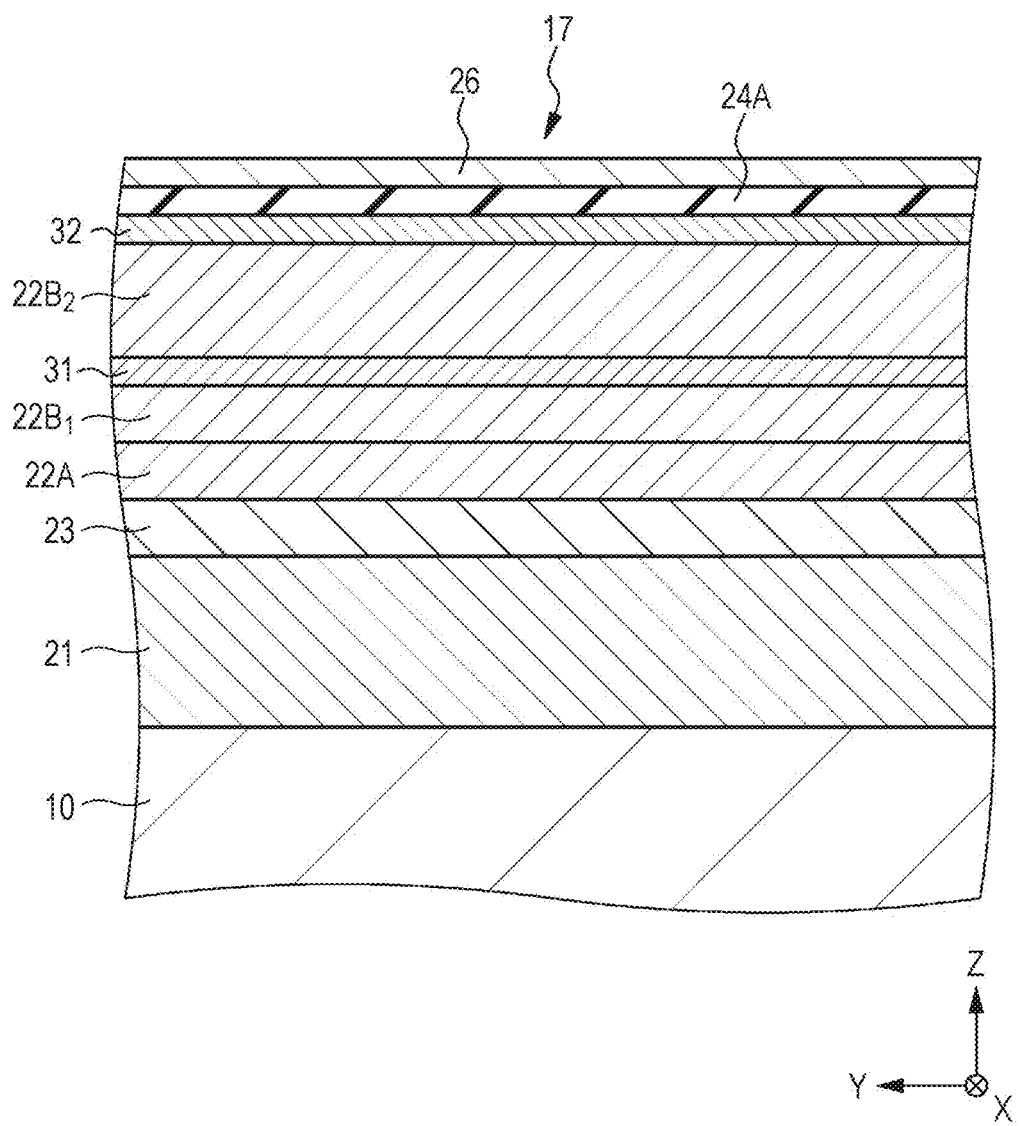
FIG. 9 is a schematic partial cross-sectional view of a light propagation region of a light-emitting element of Example 3.

Example 3 is a modification of Examples 1 and 2. As shown in FIG. 9 that is a schematic partial cross-sectional view of the light propagation region 17 of the light-emitting element of Example 3, a first dielectric film 24 is formed (refer to FIG. 3) on at least a side surface of the ridge stripe structure 12 and the top surface of the ridge stripe adjacent portions 13 in Example 3, and a second dielectric film 24A which is made from a material different from a material of the first dielectric film 24 is formed on a top surface of the light propagation region 17. Specifically, the first dielectric film 24 is made from $Ta_2O_5$, and the second dielectric film 24A is made from $SiO_2$.

Except for the above points, a configuration and a structure of the light-emitting element of Example 3 can be the same as the configuration and the structure in Examples 1 and 2, so that detailed description is not provided. As described above, by making a material of the first dielectric film 24 different from a material of the second dielectric film 24A, it is possible to increase a degree of freedom for setting values of effective refractive indexes $n_{eff-1}$ and $n_{eff-2}$ and a degree of freedom for setting values of $d_1$, $d_2$, and $d_3$.

Example 4

Example 4 is a modification of Examples 1 to 3. In Examples 1 to 3, the light-emitting element is set to a light-emitting element emitting a red color, and a stacked structure is configured from an AlGaInP-based compound semiconductor. On the other hand, in a light-emitting element of Example 4, the light-emitting element is set to a light-emitting element emitting a blue color or a green color, and a stacked structure is configured from an AlGaInN-based compound semiconductor. In addition, etching of the AlGaInN-based compound semiconductor layer can be performed by dry etching, and formation of an etching stop layer is usually not necessary. An amount of etching (etching depth) can be controlled by etching time. Alternatively, by irradiating the stacked structure with a laser beam, and using a phenomenon that reflectance of the laser beam periodically changes by changing a thickness of the stacked structure by etching, it is possible to detect a stop position of the etching.

A configuration of the stacked structure 20 which is made from the AlGaInN-based compound semiconductor in the light-emitting element (semiconductor light-emitting element) emitting a blue color or a green color is shown in Table 3 below. However, a compound semiconductor layer which is described at the bottom is formed on the substrate 10 which is made from an n-GaN substrate.

TABLE 3

| | Composition |
|---|---|
| Second compound semiconductor layer 22 | |
| Third layer (contact layer) | p-GaN:Mg |

TABLE 3-continued

|  | Composition |
|---|---|
| Second layer (second cladding layer) 22B | p-AlGaN:Mg |
| First layer (second light guide layer) 20A | GaInN |
| Active layer 23 |  |
| Well layer/barrier layer | GaInN/GaN |
| First compound semiconductor layer 21 |  |
| First light guide layer | GaInN |
| First cladding layer | n-AlGaN:Si |
| Buffer layer | n-GaN |

Except for the above points, the light-emitting element or a method of manufacturing the light-emitting element of Example 4 can be the same as the light-emitting element or the method of manufacturing the light-emitting element described in Examples 1 to 3, so that detailed description is not provided.

Moreover, in Example 4, a thickness $d_3$ of the second compound semiconductor layer 22 in the ridge stripe structure 12 is a sum of thicknesses of the first layer 22A, the $2A^{th}$ layer $22B_1$, the $2B^{th}$ layer $22B_2$, the $2C^{th}$ layer $22B_3$ and the third layers 22C and 22D of the second compound semiconductor layer 22. In addition, a thickness $d_2$ of the second compound semiconductor layer in the light propagation region 17 is a sum of thicknesses of the first layer 22A, the $2A^{th}$ layer $22B_1$ and the $2B^{th}$ layer $22B_2$ of the second compound semiconductor layer 22. Furthermore, a thickness $d_1$ of the second compound semiconductor layer in the ridge stripe adjacent portions 13 is a sum of thicknesses of the first layer 22A and the $2A^{th}$ layer $22B_1$ of the second compound semiconductor layer 22.

Example 5

Figure 10:
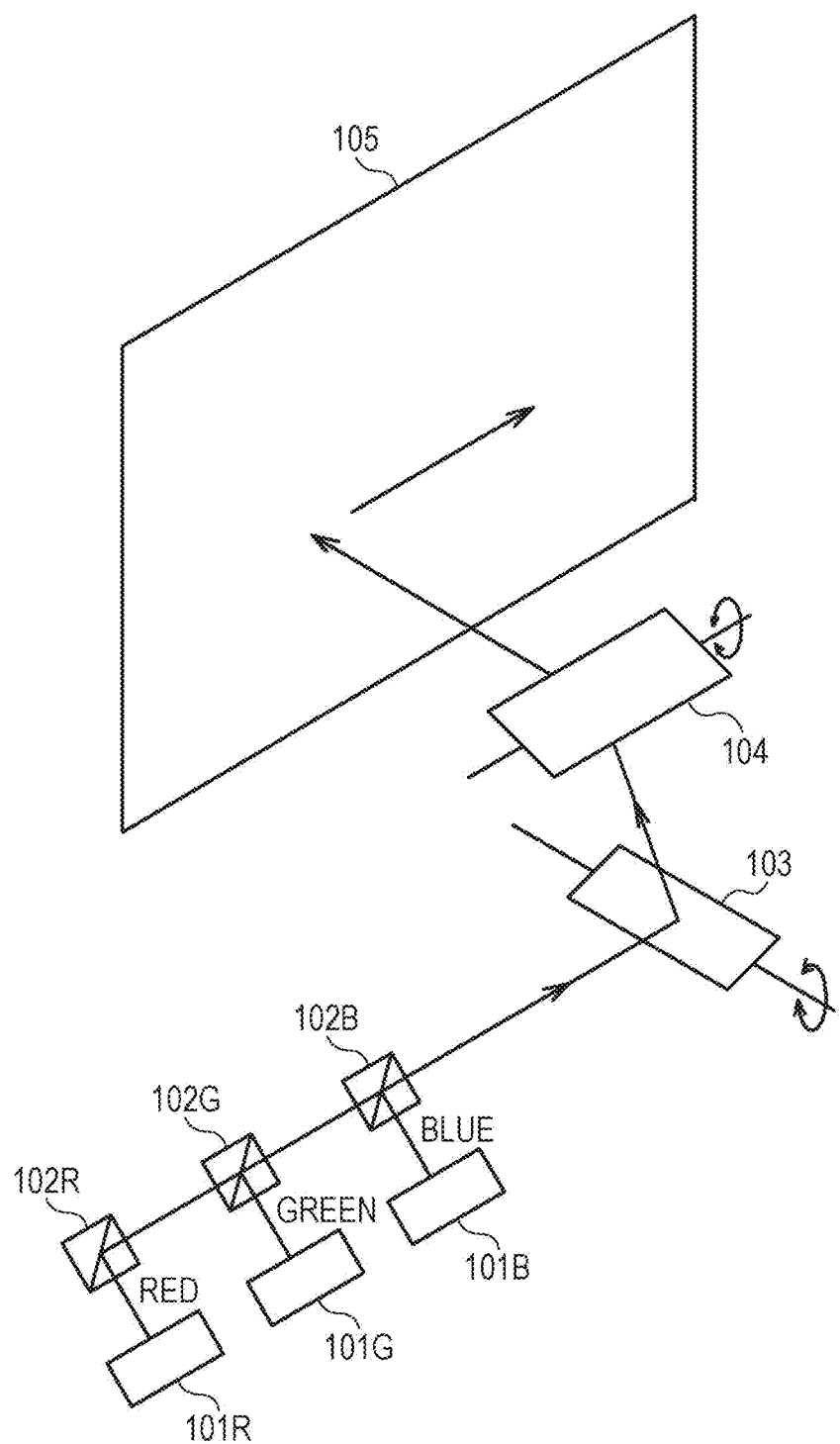
FIG. 10 is a conceptual diagram of a display device of Example 5.

Example 5 relates to a display device of the present disclosure. In Example 5, as shown in FIG. 10 which is a conceptual diagram, the display device is set to a raster scan type projector device including a light-emitting element (semiconductor light-emitting element) as a light source. The projector device performs a raster scan on light with a light-emitting element made from a SLD as a light source, and displays an image by controlling brightness of light according to an image to be displayed. Specifically, respective light from a light-emitting element 101R emitting red light, a light-emitting element 101G emitting green light, and a light-emitting element 101B emitting blue light is combined to one beam by dichroic prisms 102R, 102G, and 102B, and the beam is scanned by a horizontal scanner 103 and a vertical scanner 104, and is projected onto an irradiated surface 105 for displaying images or video such as a screen, a wall, and the like, thereby obtaining an image. The horizontal scanner 103 and the vertical scanner 104 can combine, for example, a polygon mirror and a galvanometer scanner. Alternatively, the horizontal scanner and the vertical scanner can include, for example, a combination of a plurality of Digital Micro-mirror Devices (DMD) manufactured using an MEMS technology, and a polygon mirror or a galvanometer scanner, and can be also configured from a structure in which the horizontal scanner and the vertical scanner are integrated with each other, that is, a two-dimensional space modulation element which is made by arranging the DMD in a two-dimensional matrix shape, and from a two-dimensional MEMS scanner which performs a two-dimensional scan in a single DMD. Furthermore, it is also possible to use a refractive index modulation type scanner such as acousto-optic effect scanner and an electro-optic effect scanner.

Figure 11:
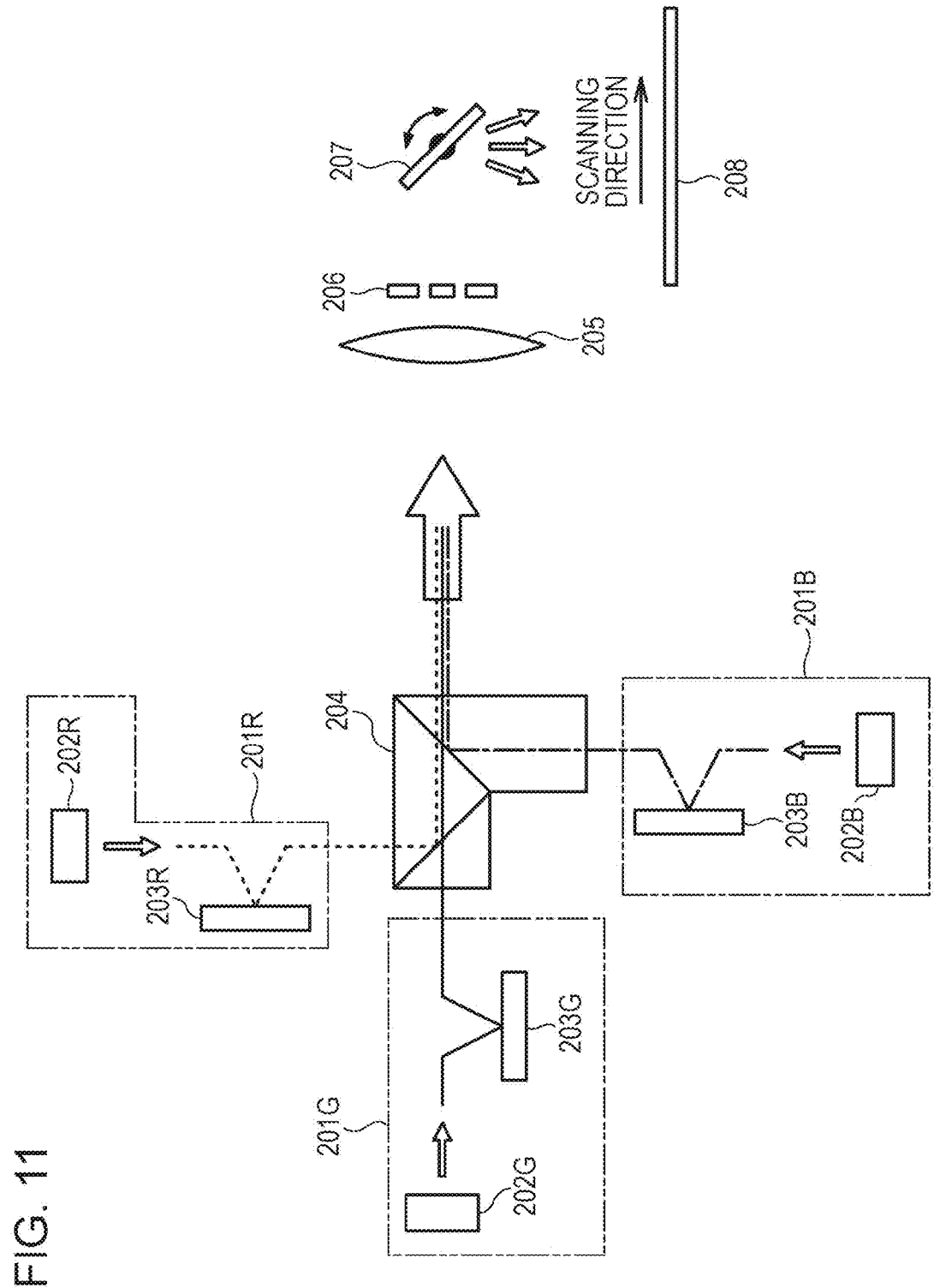
FIG. 11 is a conceptual diagram of another display device in Example 5.

Alternatively, it is also possible to include a combination of a plurality of Grating Light Valve (GLV) element which are one-dimensional space modulation elements and a polygon mirror or a galvanometer scanner. That is, as shown in a conceptual diagram of FIG. 11, the display device includes an image generation device 201R which is made from a GLV element 203R and a light source (red light-emitting element) 202R, an image generation device 201G which is made from a GLV element 203G and a light source (green light-emitting element) 202G, and an image generation device 201B which is made from a GLV element 203B and a light source (blue light-emitting element) 202B. Moreover, red light emitted from the light source (red light-emitting element) 202R is indicated by a dotted line, green light emitted from the light source (green light-emitting element) 202G is indicated by a solid line, and blue light emitted from the light source (blue light-emitting element) 202B is indicated by a dashed line. The display device is configured from a light collecting lens (not illustrated) which collects light emitted from these light sources 202R, 202G, and 202B, and makes the light incident to the GLV elements 203R, 203G, and 203B, an L-shaped prism 204 through which light emitted from the GLV elements 203R, 203G, and 203B is incident and is combined into one light beam, a lens 205 and a spatial filter 206 through which light of the combined three primary colors passes, an imaging lens (not illustrated) which performs imaging on one light beam passing through the spatial filter 206, a scan mirror (galvanometer scanner) 207 which scans one light beam passing through the imaging lens, and a screen (irradiated surface) 208 which projects light scanned by the scan mirror 207.

The present disclosure is described based on preferable embodiments; however, the present disclosure is not limited to these embodiments. A configuration and a structure of the light-emitting element and the display device and the method of manufacturing a light-emitting element described in the embodiments are only exemplifications, and can be appropriately modified. A transparent conductive material layer may be formed between the second electrode and the second compound semiconductor layer. The light-emitting end surface is formed in a shape of rotating about an axis parallel to a Y direction depending on a material to be used in some cases.

Figure 12:
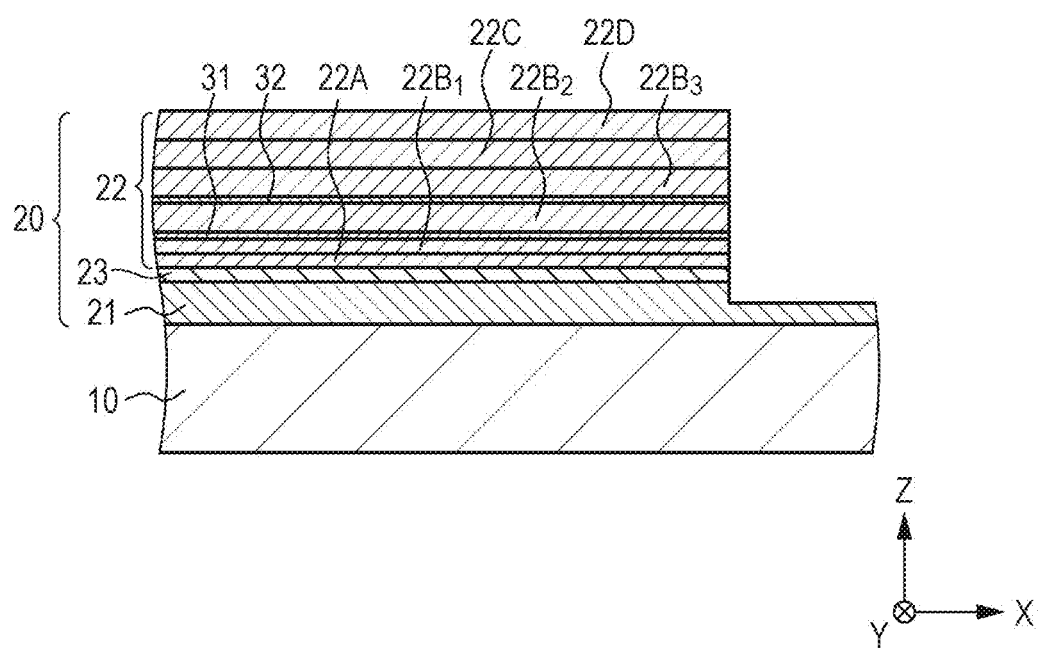
FIG. 12 is a schematic cross-sectional view of a stacked structure and the like of a modification example of the light-emitting element of Example 1, which is the same as the view taken along an arrow IIB-IIB of FIG. 1A.

In some cases, instead of forming a mask layer on the second layer of the second compound semiconductor layer in the region for forming the light propagation region, the mask layer may be formed in the middle of forming the first compound semiconductor layer. A partial cross-sectional view of the light-emitting element obtained in this manner, which is the same as the view taken along an arrow IIB-IIB of FIG. 1A, is shown in FIG. 12. The light-emitting element shown in FIG. 12 can be manufactured based on a manufacturing method substantially the same as the method of manufacturing a light-emitting element described in Example 2 except for an order of forming the mask layer and a procedure of forming a stacked structure.

Figure 13A:
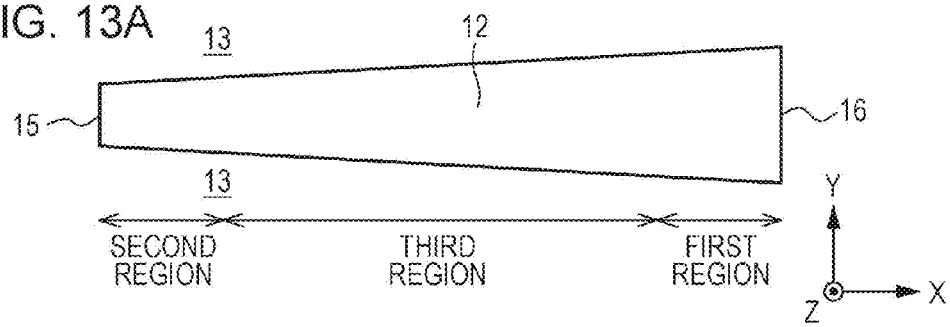
FIGS. 13A, 13B, 13C, and 13D are diagrams which show an outline of a ridge stripe structure with a flare structure.
Figure 13B:
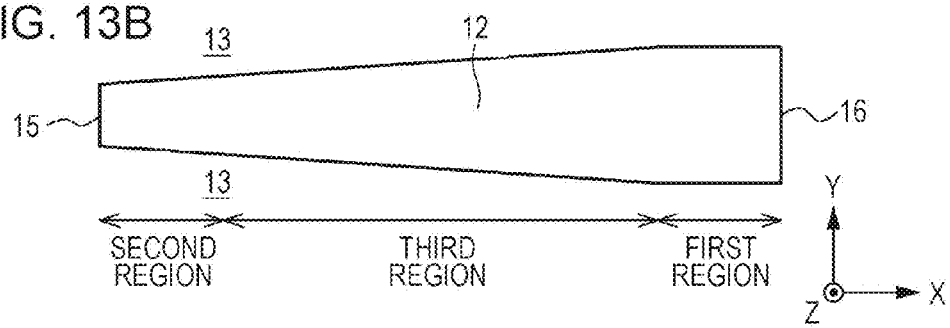
Figure 13C:
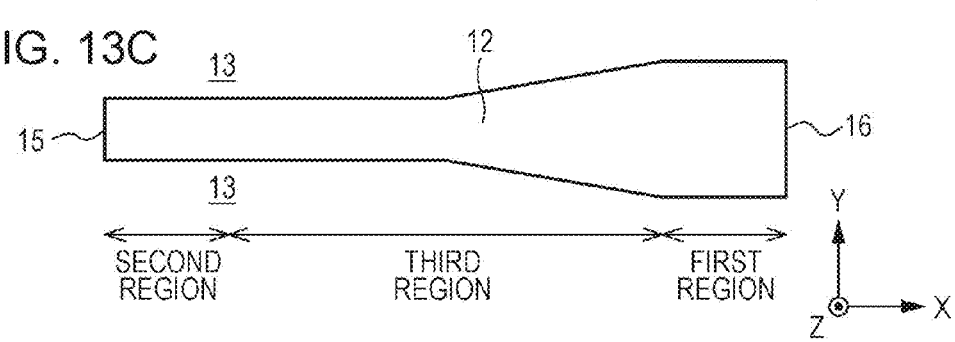
Figure 13D:
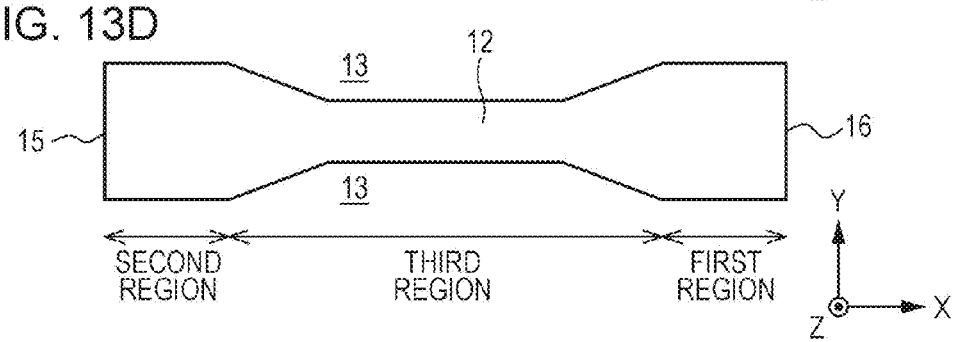

The ridge stripe structure may have a flare structure. Specifically, for example, as shown by an outline of the ridge stripe structure in FIG. 13A, a width $W_R$ of the ridge stripe structure 12 is the widest at the interface 16 between the light-emitting region 11 and the light propagation region 17, and gradually narrows towards the light reflection end surface 15 in a first region, a second region, and a third region. Alternatively, as shown by an outline of the ridge stripe structure in FIG. 13B, the width $W_R$ of the ridge stripe structure 12 is the widest at the interface 16 between the light-emitting region 11 and the light propagation region 17, is constant in the first region, and gradually narrows towards the light reflection end surface 15 in the second region and the third region. Alternatively, as shown by an outline of the ridge stripe structure in FIG. 13C, a width $W_R$ of the ridge stripe structure 12 is the widest at the interface 16 between the light-emitting region 11 and the light propagation region 17, is constant in the first region, gradually narrows towards the light reflection end surface and then becomes a constant width in the second region, and the width is constant in the third region. Alternatively, as shown by an outline of the ridge stripe structure in FIG. 13D, the width $W_R$ of the ridge stripe structure 12 is the widest at the interface 16 between the light-emitting region 11 and the light propagation region 17, is constant in the first region, gradually narrows towards the light reflection end surface, becomes a constant width, and then gradually widens towards the light reflection end surface in the second region, and the width is constant in the third region.

Figure 14:
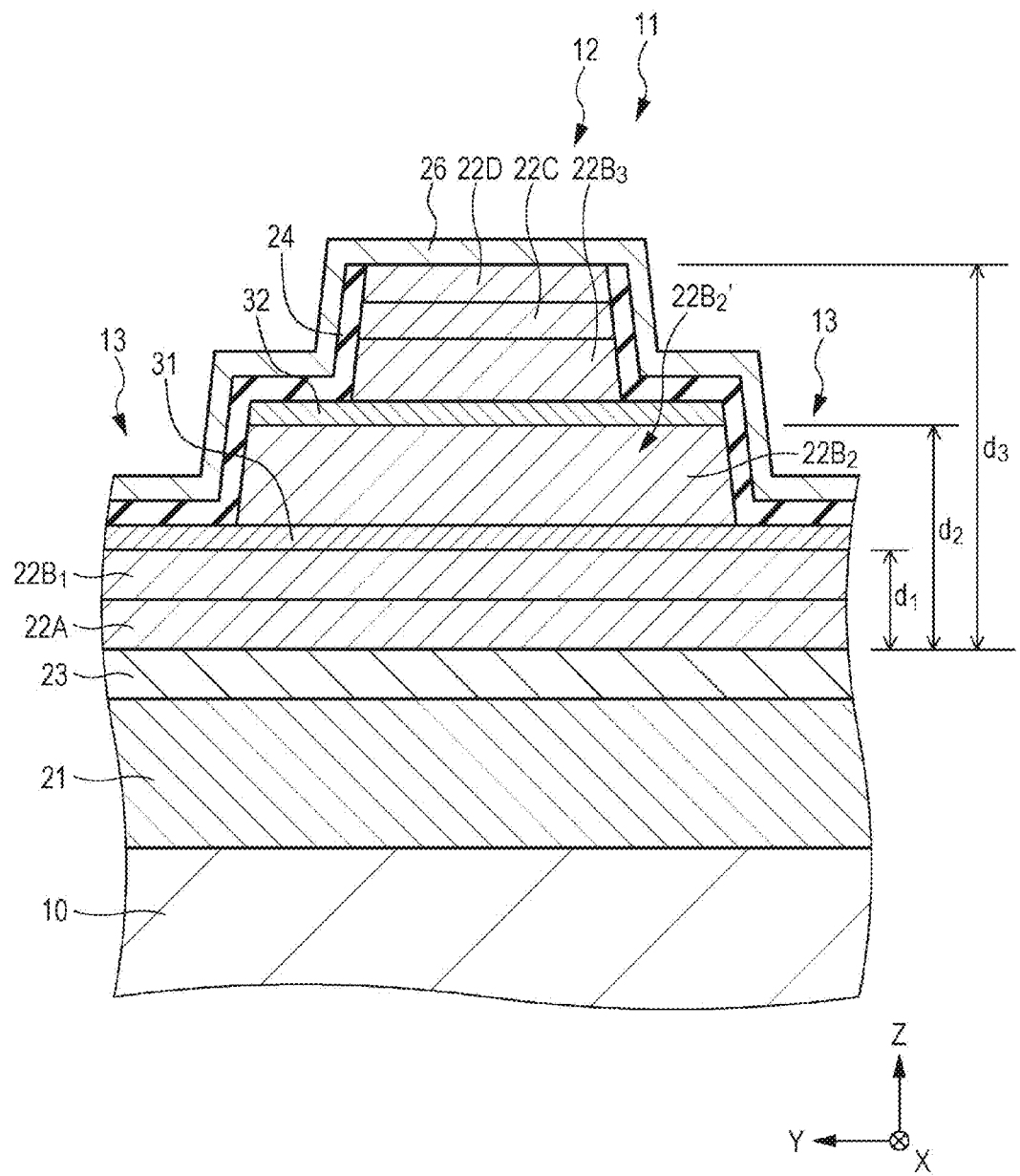
FIG. 14 is a schematic partial cross-sectional view of a light-emitting region of a light-emitting element of a modification example of Example 1.

In the embodiment, a cross-sectional shape when cutting the ridge stripe structure 12 on an XY plane is set to an isosceles trapezoid; however, is not limited thereto, but can be a rectangle. Alternatively, as shown in a schematic partial cross-sectional view of FIG. 14, the cross-sectional shape can be a multistage shape (stairs-shape). Specifically, for example, a width of a portion in which a thickness of the second compound semiconductor layer is $d_2$ is wider than a width of a top surface of the second compound semiconductor layer, and the portion in which the thickness of the second compound semiconductor layer is $d_2$ has a shape of protruding in a Y direction from a portion of the second compound semiconductor layer positioned higher than the portion. That is, a width of the $2B^{th}$ layer $22B_2$ of the second compound semiconductor layer 22 is wider than a width of the third layers 22C and 22D of the second compound semiconductor layer 22, and the $2B^{th}$ layer $22B_2$ of the second compound semiconductor layer 22 protrudes from the $2C^{th}$ layer $22B_3$ of the second compound semiconductor layer in a Y direction. Then, the second etching stop layer 32 is left on a protrusion portion $22B_2'$ of the $2B^{th}$ layer $22B_2$ of the second compound semiconductor layer 22. However, the multistage shape (stairs shape) is not limited to such a shape, and there can be more multistage shapes.

Moreover, the present disclosure can take the following configuration.

[A01] Light-Emitting Element . . . First Form

A light-emitting element including a light-emitting region which is made from a stacked structure configured from a first compound semiconductor layer, an active layer, and a second compound semiconductor layer, and a light propagation region which is made from the stacked structure, extends from the light-emitting region, and has a light-emitting end surface, in which the light-emitting region is configured from a ridge stripe structure and ridge stripe adjacent portions positioned at both sides of the ridge stripe structure, and when a thickness of the second compound semiconductor layer in the ridge stripe adjacent portions is set to $d_1$, a thickness of the second compound semiconductor layer in the light propagation region is set to $d_2$, and a thickness of the second compound semiconductor layer in the ridge stripe structure is set to $d_3$, $d_3 > d > d_1$ is satisfied.

[A02] The light-emitting element according to [A01], in which when an effective refractive index of the light-emitting region is set to $n_{eff\text{-}1}$, and an effective refractive index of the light propagation region is set to $n_{eff\text{-}2}$, $|n_{eff\text{-}1} - n_{eff\text{-}2}| \le 8 \times 10^{-4}$ is satisfied.

[A03] Light-Emitting Element . . . Second Form

A light-emitting element including a light-emitting region which is made from a stacked structure configured from a first compound semiconductor layer, an active layer, and a second compound semiconductor layer, and a light propagation region which is made from the stacked structure, extends from the light-emitting region, and has a light-emitting end surface, in which the light-emitting region is configured from a ridge stripe structure and ridge stripe adjacent portions positioned at both sides of the ridge stripe structure, and when an effective refractive index of the light-emitting region is set to $n_{eff\text{-}1}$, and an effective refractive index of the light propagation region is set to $n_{eff\text{-}2}$, $|n_{eff\text{-}1} - n_{eff\text{-}2}| \le 8 \times 10^{-4}$ is satisfied.

[A04] The light-emitting element described in any one of [A01] to [A03], in which a length of the light propagation region is 40 μm or more.

[A05] The light-emitting element described in any one of [A01] to [A04], in which, when a width of an active layer at an interface between the light-emitting region and the light propagation region is set to $W_1$, and a length of the light propagation region is set to $L_2$, $20 \le L_2/W_1 \le 60$ is satisfied.

[A06] The light-emitting element described in any one of [A01] to [A05], in which the light-emitting region includes a light reflection end surface, light reflectance on the light reflection end surface is 99% or more, and light reflectance on the light-emitting end surface is 1% or less.

[A07] The light-emitting element described in any one of [A01] to [A06], in which a current is injected into the ridge stripe structure and a current is not injected into the light propagation region.

[A08] The light-emitting element described in [A07], in which the first compound semiconductor layer is electrically connected to a first electrode, and a second electrode is formed on a top surface of a stacked structure which configures at least a ridge stripe structure.

[A09] The light-emitting element described in any one of [A01] to [A07], in which a compound semiconductor is made from an AlGaInN-based compound semiconductor.

[A10] The light-emitting element described in any one of [A01] to [A08], in which a first etching stop layer and a second etching stop layer are formed in the stacked structure which configures the ridge stripe structure, the first etching stop layer is formed in the stacked structure which configures the light propagation region, the top surface of the stacked structure which configures the light propagation region is configured from the second etching stop layer, and a top surface of a stacked structure which configures the ridge stripe adjacent portions is configured from the first etching stop layer.

[A11] The light-emitting element described in any one of [A01] to [A08], in which a compound semiconductor is made from an AlGaInP-based compound semiconductor.

[A12] The light-emitting element described in any one of [A01] to [A11], in which a first dielectric film is formed on at least a side surface of the ridge stripe structure and a top surface of the ridge stripe adjacent portions, and a second dielectric film which is made from a material different from a material configuring the first dielectric film is formed on a top surface of the light propagation region.

[A13] The light-emitting element described in any one of [A01] to [A12], in which the ridge stripe structure extends in a straight-line shape.

[A14] The light-emitting element described in any one of [A01] to [A13], in which, when a direction in which the ridge stripe structure extends is set to an X direction, a width direction of the active layer is set to a Y direction, and a thickness direction of the active layer is set to a Z direction, a cut surface of a light-emitting end surface when cutting the light propagation region on a virtual XY plane including the active layer is a straight line extending in the Y direction.

[A15] The light-emitting element described in any one of [A01] to [A14], in which a half width of a light-emitting spectrum of light emitted from the light-emitting end surface is 1 nm or more.

[A16] The light-emitting element described in any one of [A01] to [A15], in which the light-emitting element is made from a super luminescent diode.

[B01] Method of Manufacturing Light-Emitting Element . . . First Form

A method of manufacturing a light-emitting element which includes a light-emitting region that is made from a stacked structure configured from a first compound semiconductor layer, an active layer, and a second compound semiconductor layer, and a light propagation region that is made from the stacked structure, extends from the light-emitting region, and has a light-emitting end surface, and in which the light-emitting region is configured from a ridge stripe structure and ridge stripe adjacent portions positioned at both sides of the ridge stripe structure, and when a thickness of the second compound semiconductor layer in the ridge stripe adjacent portions is set to $d_1$, a thickness of the second compound semiconductor layer in the light propagation region is set to $d_2$, and a thickness of the second compound semiconductor layer in the ridge stripe structure is set to $d_3$, $d_3 > d > d_1$ is satisfied, the method including:

(a) forming successively the first compound semiconductor layer, the active layer, a first layer of the second compound semiconductor layer, a second layer of the second compound semiconductor layer, and a third layer of the second compound semiconductor layer; and (b) removing the third layer of the second compound semiconductor layer in a region for forming the light propagation region and removing the third layer of the second compound semiconductor layer and the second layer of the second compound semiconductor layer in a region for forming the ridge stripe adjacent portions.

[B02] Method of Manufacturing Light-Emitting Element . . . Second Form

A method of manufacturing a light-emitting element which includes a light-emitting region that is made from a stacked structure configured from a first compound semiconductor layer, an active layer, and a second compound semiconductor layer, and a light propagation region that is made from the stacked structure, extends from the light-emitting region, and has a light-emitting end surface, and in which the light-emitting region is configured from a ridge stripe structure and ridge stripe adjacent portions positioned at both sides of the ridge stripe structure, and when an effective refractive index of the light-emitting region is set to $n_{\it{eff-1}}$, and an effective refractive index of the light propagation region is set to $n_{\it{eff-2}}$, $|n_{\it{eff-1}} - n_{\it{eff-2}}| \leq 8 \times 10^{-4}$ is satisfied, the method including:

(a) forming successively the first compound semiconductor layer, the active layer, the first layer of the second compound semiconductor layer, the second layer of the second compound semiconductor layer, and the third layer of the second compound semiconductor layer; and (b) removing the third layer of the second compound semiconductor layer in a region for forming the light propagation region, and removing the third layer of the second compound semiconductor layer and the second layer of the second compound semiconductor layer in a region for forming the ridge stripe adjacent portions.

[B03] Method of Manufacturing Light-Emitting Element . . . Third Form

The method of manufacturing a light-emitting element described in [B01] or [B02], in which, in the process (a), the first compound semiconductor layer, the active layer, the first layer of the second compound semiconductor layer, the $2A^{th}$ layer of the second compound semiconductor layer, the first etching stop layer, the $2B^{th}$ layer of the second compound semiconductor layer, the second etching stop layer, the $2C^{th}$ layer of the second compound semiconductor layer, and the third layer of the second compound semiconductor layer are successively formed, and in the process (b), the third layer of the second compound semiconductor layer and the $2C^{th}$ layer of the second compound semiconductor layer in a region for forming the light propagation region are removed, and the third layer of the second compound semiconductor layer, the $2C^{th}$ layer of the second compound semiconductor layer, the second etching stop layer, and the $2B^{th}$ layer of the second compound semiconductor layer in a region for forming the ridge stripe adjacent portions are removed.

[B04] Method of Manufacturing Light-Emitting Element . . . Fourth Form

A method of manufacturing a light-emitting element which includes a light-emitting region that is made from a stacked structure configured from a first compound semiconductor layer, an active layer, and a second compound semiconductor layer, and a light propagation region that is made from the stacked structure, extends from the light-emitting region, and has a light-emitting end surface, and in which the light-emitting region is configured from a ridge stripe structure and ridge stripe adjacent portions positioned at both sides of the ridge stripe structure, and when a thickness of the second compound semiconductor layer in the ridge stripe adjacent portions is set to $d_1$, a thickness of the second compound semiconductor layer in the light propagation region is set to $d_2$, and a thickness of the second compound semiconductor layer in the ridge stripe structure is set to $d_3$, $d_3 > d > d_1$ is satisfied, the method including:

(a) forming successively the first compound semiconductor layer, the active layer, a first layer of the second compound semiconductor layer, and a second layer of the second compound semiconductor layer;

(b) forming a mask layer on the second layer of the second compound semiconductor layer in a region for forming the light propagation region;

(c) forming a third layer of the second compound semiconductor layer on the second layer of the second compound semiconductor layer in a region for forming the light-emitting region; and (d) removing the third layer of the second compound semiconductor layer and the second layer of the second compound semiconductor layer in a region for forming the ridge stripe adjacent portions.

[B05] A method of manufacturing a light-emitting element which includes a light-emitting region that is made from a stacked structure configured from a first compound semiconductor layer, an active layer, and a second compound semiconductor layer, and a light propagation region that is made from the stacked structure, extends from the light-emitting region, and has a light-emitting end surface, and in which the light-emitting region is configured from a ridge stripe structure and ridge stripe adjacent portions positioned at both sides of the ridge stripe structure, and when an effective refractive index of the light-emitting region is set to $n_{\it{eff-1}}$, and an effective refractive index of the light propagation region is set to $n_{\it{eff-2}}$, $|n_{\it{eff-1}} - n_{\it{eff-2}}| \leq 8 \times 10^{-4}$ is satisfied, the method including:

(a) forming successively the first compound semiconductor layer, the active layer, a first layer of the second compound semiconductor layer, and a second layer of the second compound semiconductor layer;

(b) forming a mask layer on the second layer of the second compound semiconductor layer in a region for forming the light propagation region;

(c) forming a third layer of the second compound semiconductor layer on the second layer of the second compound semiconductor layer in a region for forming the light-emitting region; and (d) removing a third layer of the second compound semiconductor layer and a second layer of the second compound semiconductor layer in a region for forming the ridge stripe adjacent portions.

[B06] The method of manufacturing a light-emitting element described in [B04] or [B05], in which, in the process (a), the first compound semiconductor layer, the active layer, the first layer of the second compound semiconductor layer, a $2A^{th}$ layer of the second compound semiconductor layer, an etching stop layer, and a $2B^{th}$ layer of the second compound semiconductor layer are formed.

[C01] Display Device

A display device including the light-emitting element described in any one of [A01] to [A13].

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting element comprising:
a light-emitting region which is made from a stacked structure configured from a first compound semiconductor layer, an active layer, and a second compound semiconductor layer; and
a light propagation region which is made from the stacked structure, extends from the light-emitting region, and has a light-emitting end surface,
wherein,
the light-emitting region is configured from a ridge stripe structure and ridge stripe adjacent portions positioned at both sides of the ridge stripe structure,
when a thickness of the second compound semiconductor layer in the ridge stripe adjacent portions is set to $d_1$, a thickness of the second compound semiconductor layer in the light propagation region is set to $d_2$, and a thickness of the second compound semiconductor layer in the ridge stripe structure is set to $d_3$, $d_3 > d_2 > d_1$ is satisfied, and
when an effective refractive index of the light-emitting region is set to $n_{eff\text{-}1}$, and an effective refractive index of the light propagation region is set to $n_{eff\text{-}2}$, $|n_{eff\text{-}1} - n_{eff\text{-}2}| 8 \times 10^{-4}$ is satisfied.

2. The light-emitting element according to claim 1, wherein a length of the light propagation region is 40 μm or more.

3. The light-emitting element according to claim 1, wherein, when a width of an active layer at an interface between the light-emitting region and the light propagation region is set to $W_1$, and a length of the light propagation region is set to $L_2$, $20 \leq L_2/W_1 \leq 60$ is satisfied.

4. The light-emitting element according to claim 1, wherein a current is injected into the ridge stripe structure, and a current is not injected into the light propagation region.

5. The light-emitting element according to claim 4, wherein the first compound semiconductor layer is electrically connected to a first electrode, and a second electrode is formed on a top surface of the stacked structure which configures at least the ridge stripe structure.

6. The light-emitting element according to claim 1, wherein a first etching stop layer and a second etching stop layer are formed in the stacked structure which configures the ridge stripe structure, the first etching stop layer is formed in the stacked structure which configures the light propagation region, and the top surface of the stacked structure which configures the light propagation region is configured from the second etching stop layer, and a top surface of the stacked structure which configures the ridge stripe adjacent portions is configured from the first etching stop layer.

7. The light-emitting element according to claim 1, wherein a first dielectric film is formed on at least a side surface of the ridge stripe structure and a top surface of the ridge stripe adjacent portions, and a second dielectric film, which is made from a material different from a material configuring the first dielectric film, is formed on a top surface of the light propagation region.

8. The light-emitting element according to claim 1, wherein the ridge stripe structure extends in a straight-line shape.

9. The light-emitting element according to claim 8, wherein, when a direction in which the ridge stripe structure extends is set to an X direction, a width direction of the active layer is set to a Y direction, and a thickness direction of the active layer is set to a Z direction, a cut surface of a light-emitting end surface when cutting the light propagation region on a virtual XY plane including the active layer is a straight line extending in the Y direction.

10. The light-emitting element according to claim 1, wherein a half width of a light-emitting spectrum of light emitted from the light-emitting end surface is 1 nm or more.

11. The light-emitting element according to claim 1, wherein the light-emitting element is made from a super luminescent diode.

12. A display device comprising:
a light-emitting element including:
a light-emitting region which is made from a stacked structure configured from a first compound semiconductor layer, an active layer, and a second compound semiconductor layer; and
a light propagation region which is made from the stacked structure, extends from the light-emitting region, and has a light-emitting end surface,
wherein,
the light-emitting region is configured from a ridge stripe structure and ridge stripe adjacent portions positioned at both sides of the ridge stripe structure,
when a thickness of the second compound semiconductor layer in the ridge stripe adjacent portions is set to $d_1$, a thickness of the second compound semiconductor layer in the light propagation region is set to $d_2$, and a thickness of the second compound semiconductor layer in the ridge stripe structure is set to $d_3$, $d_3 > d_2 > d_1$ is satisfied, and
when an effective refractive index of the light-emitting region is set to $n_{eff\text{-}1}$, and an effective refractive index of the light propagation region is set to $n_{eff\text{-}2}$, $|n_{eff\text{-}1} - n_{eff\text{-}2}| 8 \times 10^{-4}$ is satisfied.

13. The display device according to claim 12, wherein the display device further includes at least one dichroic prism.

14. The display device according to claim 12, wherein a length of the light propagation region is 40 μm or more.

15. The display device according to claim 12, wherein, when a width of an active layer at an interface between the light-emitting region and the light propagation region is set to $W_1$, and a length of the light propagation region is set to $L_2$, $20 \leq L_2/W_1 \leq 60$ is satisfied.

16. The display device according to claim 12, wherein a current is injected into the ridge stripe structure, and a current is not injected into the light propagation region.

17. The display device according to claim 12, wherein a first etching stop layer and a second etching stop layer are formed in the stacked structure which configures the ridge stripe structure, the first etching stop layer is formed in the stacked structure which configures the light propagation region, and the top surface of the stacked structure which configures the light propagation region is configured from the second etching stop layer, and a top surface of the stacked structure which configures the ridge stripe adjacent portions is configured from the first etching stop layer.

18. The display device according to claim 12, wherein a first dielectric film is formed on at least a side surface of the ridge stripe structure and a top surface of the ridge stripe adjacent portions, and a second dielectric film, which is made from a material different from a material configuring the first dielectric film, is formed on a top surface of the light propagation region.

19. The display device according to claim 12, wherein the ridge stripe structure extends in a straight-line shape.

20. The display device according to claim 12, wherein the light-emitting element is made from a super luminescent diode.

\* \* \* \* \*